(12) United States Patent
Kimura et al.

(10) Patent No.: US 8,314,601 B2
(45) Date of Patent: Nov. 20, 2012

(54) SEMICONDUCTOR DEVICE, DISPLAY DEVICE AND ELECTRONIC DEVICE

(75) Inventors: Hajime Kimura, Kanagawa (JP); Yasuko Watanabe, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/327,942

(22) Filed: Dec. 16, 2011

(65) Prior Publication Data
US 2012/0086692 A1    Apr. 12, 2012

Related U.S. Application Data

(63) Continuation of application No. 12/843,176, filed on Jul. 26, 2010, now Pat. No. 8,085,028, which is a continuation of application No. 12/272,866, filed on Nov. 18, 2008, now Pat. No. 7,764,058, which is a continuation of application No. 11/559,435, filed on Nov. 14, 2006, now Pat. No. 7,456,625, which is a continuation of application No. 11/006,589, filed on Dec. 8, 2004, now Pat. No. 7,248,031, which is a continuation of application No. 10/346,055, filed on Jan. 17, 2003, now Pat. No. 6,891,356.

(30) Foreign Application Priority Data

Jan. 17, 2002  (JP) .................................. 2002-009235

(51) Int. Cl.
G05F 5/00 (2006.01)
G05F 1/40 (2006.01)
G05F 1/56 (2006.01)
(52) U.S. Cl. ......... 323/303; 323/266; 323/268; 323/299
(58) Field of Classification Search .................. 323/303, 323/266, 268, 299
See application file for complete search history.

(56) References Cited

U.S. PATENT DOCUMENTS

| 5,376,898 | A | 12/1994 | Tanaka et al. |
| 5,412,235 | A | 5/1995 | Nakajima et al. |
| 5,510,699 | A | 4/1996 | Theus et al. |
| 5,894,236 | A | 4/1999 | Mizoguchi et al. |
| 6,087,813 | A | 7/2000 | Tobita |
| 6,087,821 | A | 7/2000 | Kojima |

(Continued)

FOREIGN PATENT DOCUMENTS

EP    0625822 A2    2/1998

(Continued)

OTHER PUBLICATIONS

Chinese Office Action (application No. 03100794.5); dated Oct. 13, 2006 with English translation.

(Continued)

*Primary Examiner* — Bao Q Vu
(74) *Attorney, Agent, or Firm* — Fish & Richardson P.C.

(57) ABSTRACT

As for a transistor, overlapped are factors such as a variation of a gate insulation film which occurs due to a difference of a manufacturing process and a substrate used and a variation of a crystalline state in a channel forming region and thereby, there occurs a variation of a threshold voltage and mobility of a transistor.

This invention provides an electric circuit which used a rectification type device in which an electric current is generated only in a single direction, when an electric potential difference was applied to electrodes at both ends of the device. Then, the invention provides an electric circuit which utilized a fact that, when a signal voltage is inputted to one terminal of the rectification type device, an electric potential of the other terminal becomes an electric potential offset only by the threshold voltage of the rectification type device.

17 Claims, 18 Drawing Sheets

U.S. PATENT DOCUMENTS

| | | |
|---|---|---|
| 6,175,221 B1 | 1/2001 | Kalpakjian et al. |
| 6,249,169 B1 | 6/2001 | Okada |
| 6,268,842 B1 | 7/2001 | Yamazaki et al. |
| 6,271,713 B1 | 8/2001 | Krishnamurthy |
| 6,313,819 B1 | 11/2001 | Maekawa et al. |
| 6,331,766 B1 | 12/2001 | Kalpakjian et al. |
| 6,362,798 B1 | 3/2002 | Kimura et al. |
| 6,774,882 B2 | 8/2004 | Yamazaki et al. |
| 6,891,356 B2 | 5/2005 | Kimura et al. |
| 7,248,031 B2 | 7/2007 | Kimura et al. |
| 7,456,625 B2 | 11/2008 | Kimura et al. |
| 7,764,058 B2 | 7/2010 | Kimura et al. |
| 2003/0132930 A1 | 7/2003 | Kimura et al. |
| 2003/0132931 A1 | 7/2003 | Kimura et al. |
| 2003/0174009 A1 | 9/2003 | Kimura et al. |
| 2005/0012703 A1 | 1/2005 | Yamazaki et al. |

FOREIGN PATENT DOCUMENTS

| | | |
|---|---|---|
| EP | 0899712 A3 | 3/1999 |
| EP | 0899714 A2 | 3/1999 |
| JP | 06-334445 A | 12/1994 |
| JP | 63-34445 A | 12/1994 |
| JP | 9172329 A | 6/1997 |
| JP | 11-073165 A | 3/1999 |
| JP | 2000-004130 A | 1/2000 |
| JP | 2000-112548 A | 4/2000 |
| JP | 2000-155617 A | 6/2000 |
| JP | 2000-164604 A | 6/2000 |
| JP | 2000-194327 A | 7/2000 |
| JP | 2001-085989 A | 3/2001 |
| JP | 2001-332941 A | 11/2001 |
| KR | 2000-004886 A | 1/2000 |

OTHER PUBLICATIONS

Notice of Preliminary Rejection, Korean Application No. 2003-0003327, mailed Feb. 18, 2010 with English translation, 6 pages.

Chinese Office Action (application No. 03100794.5); dated Oct. 13, 2006.

H. Sekine et al; "Amplifier Compensation Method for a Poly-Si TFT LCLV with an Integrated Data-Driver"; IDRC; pp. 45-48; 1997.

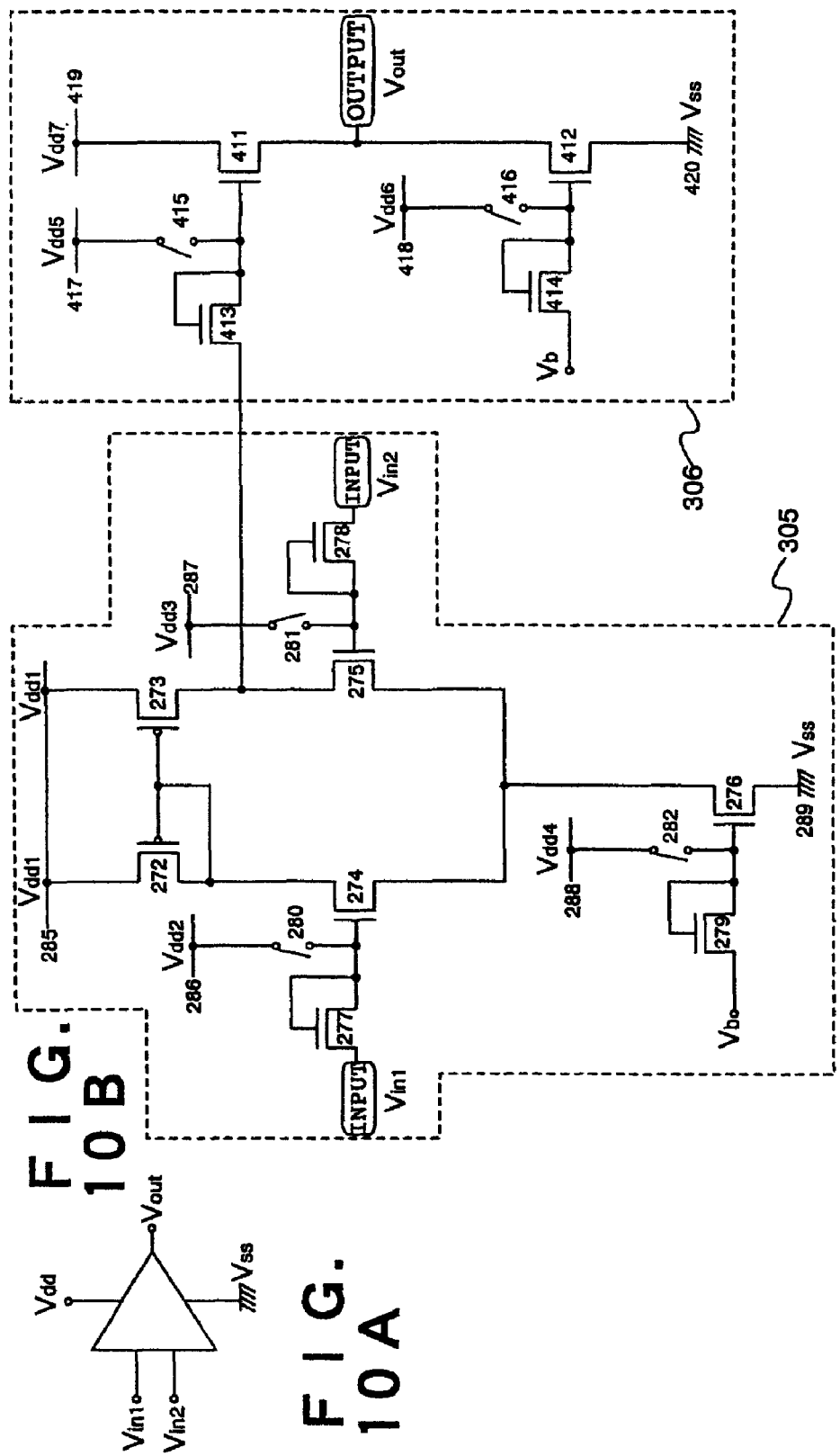

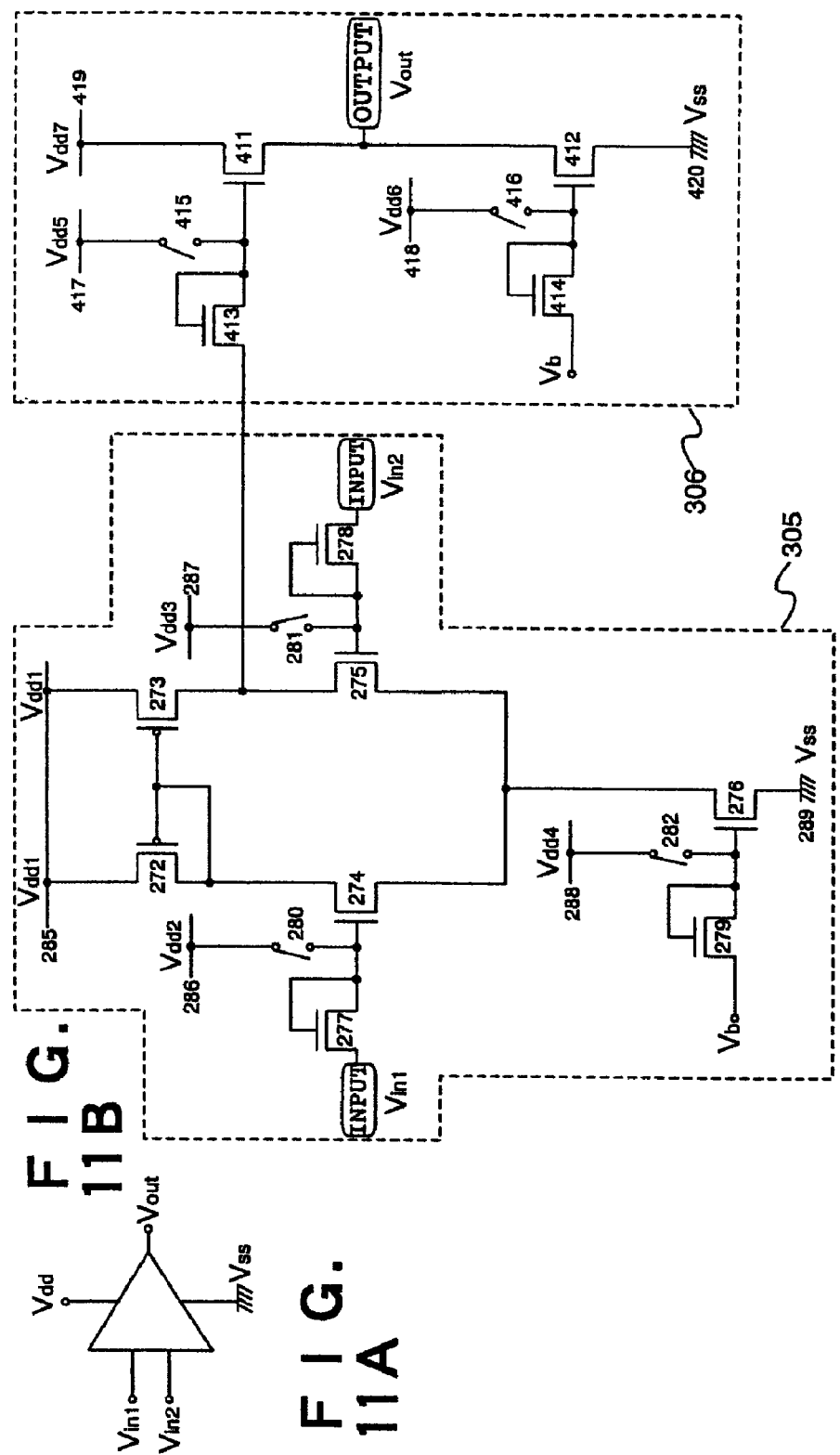

F I G. 13
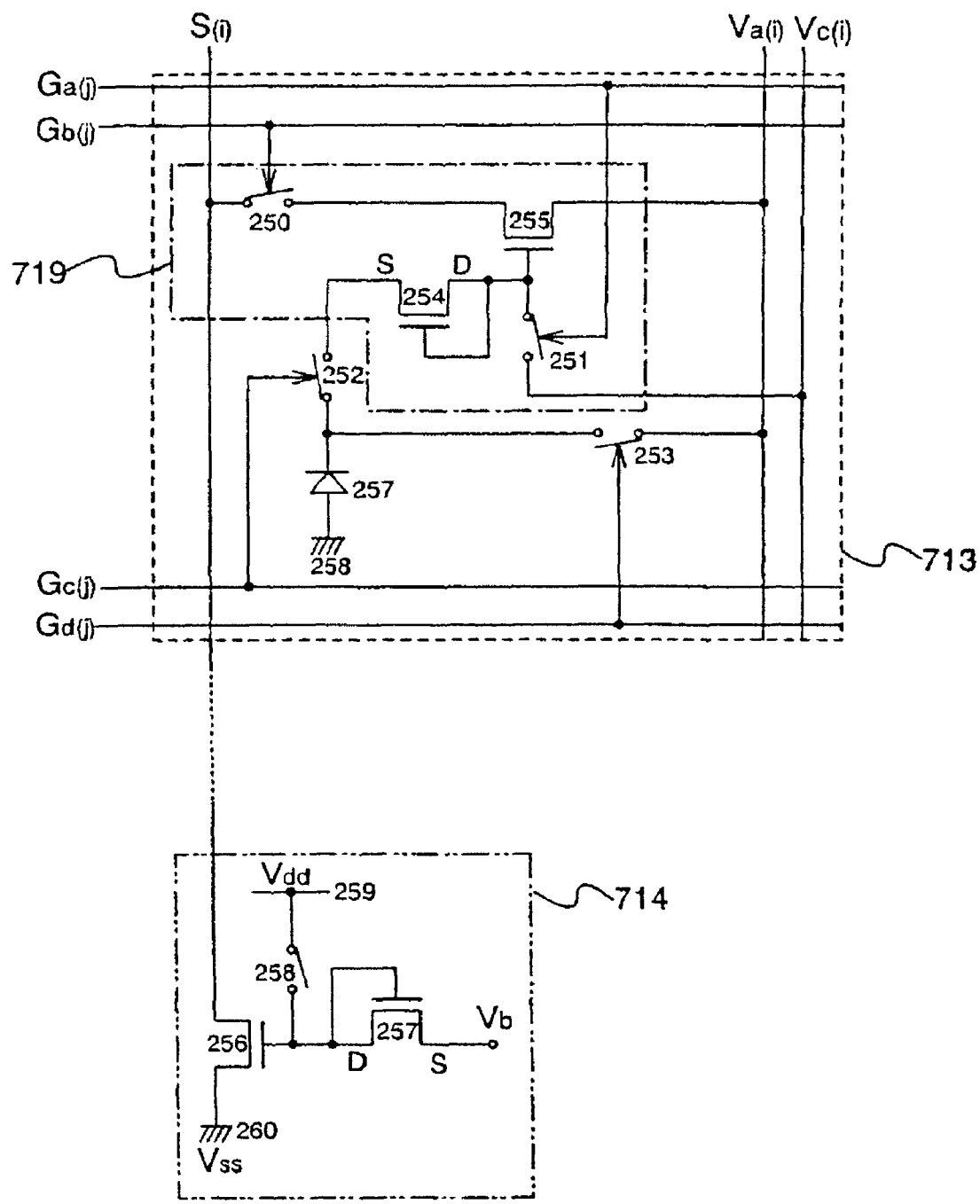

F I G. 15
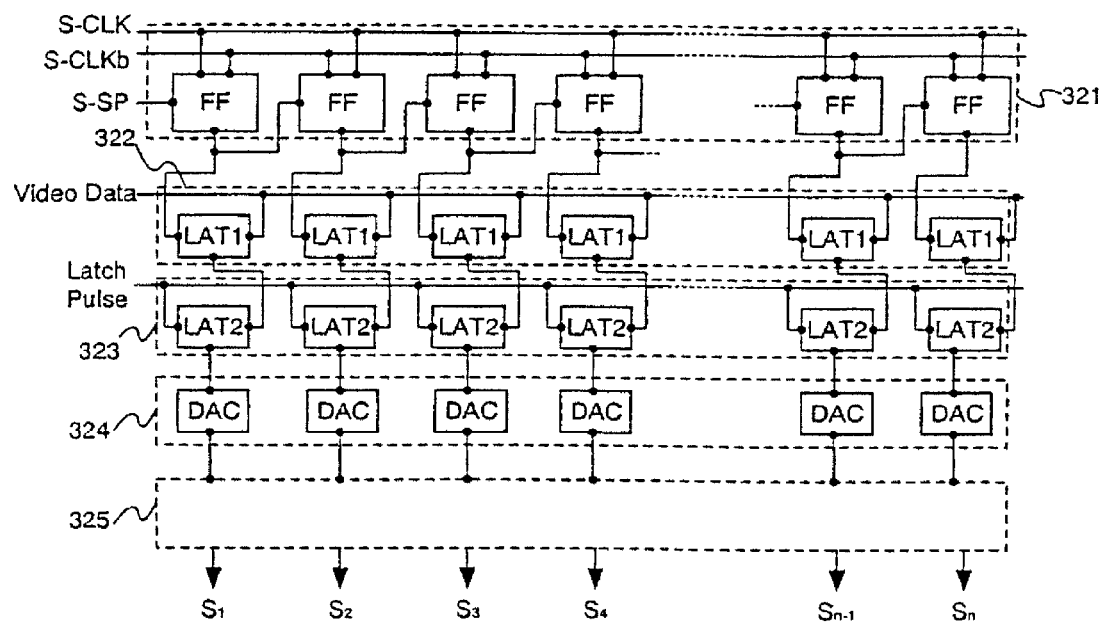

SEMICONDUCTOR DEVICE, DISPLAY DEVICE AND ELECTRONIC DEVICE

CROSS-REFERENCE TO RELATED APPLICATIONS

This application is a continuation of U.S. application Ser. No. 12/843,176, filed Jul. 26, 2010, now allowed, which is a continuation of U.S. application Ser. No. 12/272,866, filed Nov. 18, 2008, now U.S. Pat. No. 7,764,058, which is a continuation of U.S. application Ser. No. 11/559,435, filed Nov. 14, 2006, now U.S. Pat. No. 7,456,625, which is a continuation of U.S. application Ser. No. 11/006,589, filed Dec. 8, 2004, now U.S. Pat. No. 7,248,031, which is a continuation of U.S. application Ser. No. 10/346,055, filed Jan. 17, 2003, now U.S. Pat. No. 6,891,356, which claims the benefit of a foreign priority application filed in Japan as Serial No. 2002-009235 on Jan. 17, 2002, all of which are incorporated by reference.

BACKGROUND OF THE INVENTION

1. Field of the Invention

This invention relates to a technology of an electric circuit. Also, this invention relates to a technology of a semiconductor apparatus. Further, this invention belongs to a technical field of a semiconductor apparatus having an electric circuit as represented by a source follower circuit, a differential amplifier, a sense amplifier, an operational amplifier etc., a signal line drive circuit and a photoelectric transducer device.

2. Description of the Related Art

An integrated circuit (IC) which has been widely used in portable telephones and portable terminals etc. in these years is of a structure that several hundreds of thousands to several million transistors and resistors were formed on a silicon substrate of approximately 5 mm square, and plays an important role in miniaturizing an apparatus and increasing reliability of an apparatus and in mass production of apparatuses.

Then, when an electric circuit to be used in the integrated circuit (IC) etc. is designed, in many cases, an amplifier circuit having a function for amplifying a voltage and an electric current of a signal with small amplitude is designed. The amplifier circuit has been widely used, since it is an indispensable circuit for preventing the generation of distortion, thereby operating the electric circuit stably.

Here, as one example of the amplifier circuit, a structure of a source follower circuit and its operation will be described. Firstly, a structural example of the source follower circuit is shown in FIG. 5A, and an operation in a steady state will be described. Then, by use of FIGS. 5B and 5C, an operating point of the source follower circuit will be described. Finally, an example of the source follower circuit of a structure different from FIG. 5A is shown in FIG. 6, and an operation in a transient state will be described.

Firstly, by use of the source follower circuit of FIG. 5A, the operation in the steady state will be described.

In FIG. 5A, reference numeral 11 designates a n-channel type amplifying transistor and reference numeral 12 designates a n-channel type biasing transistor. In addition, the amplifying transistor 11 and the biasing transistor 12 shown in FIG. 5A are of n-channel type but, they may be configured by use of p-channel type transistors. Also, here, for the purpose of simplicity, it is assumed that the amplifying transistor 11 and the biasing transistor 12 are the same in its characteristic and size and further, an electric current characteristic is also ideal. In sum, it is assumed that, even if a voltage between a source and a drain of the amplifying transistor and the biasing transistor 12 varies, an electric current value in a saturation region does not vary.

Also, a drain region of the amplifying transistor 11 is connected to a power supply line 13, and a source region is connected to a drain region of the biasing transistor 12. A source region of the biasing transistor 12 is connected to a power supply line 14.

A bias electric potential $V_b$ is applied to a gate electrode of the biasing transistor 12. Then, a power supply electric potential $V_{dd}$ is applied to the power supply line 13, and a ground electric potential $V_{ss}$ is applied to the power supply line 14.

In the source follower circuit shown in FIG. 5A, a gate electrode of the amplifying transistor 11 becomes an input terminal, and an input electric potential $V_{in}$ is applied to the gate electrode of the amplifying transistor 11. Also, a source region of the amplifying transistor 11 becomes an output terminal, and an electric potential of a source region of the amplifying transistor 11 becomes an output electric potential $V_{out}$. The bias electric potential $V_b$ is applied to the gate electrode of the biasing transistor 12, and it is assumed that, when the biasing transistor 12 operates in a saturation region, an electric current shown by $I_b$ flows. At this time, since the amplifying transistor 11 and the biasing transistor 12 are connected serially, electric currents of the same amount flow through the both transistors. That is, when the electric current $I_b$ flows through the biasing transistor 12, the electric current $I_b$ also flows through the amplifying transistor 11.

Here, the output electric potential $V_{out}$ in the source follower circuit will be calculated. The output electric potential $V_{out}$ becomes a value which is smaller than the input electric potential $V_{in}$ by just the voltage $V_{gs1}$ between the gate and the source of the amplifying transistor 11. At this time, a relation of the input electric potential $V_{in}$, the output electric potential $V_{out}$ and the voltage $V_{gs1}$ between the gate and the source satisfies the following equation (1).

$$V_{out} = V_{in} - V_{gs1} \qquad (1)$$

Then, since, in case that the amplifying transistor 11 operates in the saturation region, the electric current $I_b$ flows through the amplifying transistor 11, it is necessary that the voltage $V_{gs1}$ between the gate and the source of the amplifying transistor 11 is equal to the bias electric potential $V_b$. Then, the following equation (2) is achieved. However, the equation (2) is achieved only when the amplifying transistor 11 and the biasing transistor 12 operate in the saturation region.

$$V_{out} = V_{in} - V_b \qquad (2)$$

Then, by use of FIGS. 5B and 5C showing a relation of voltages and electric currents of the amplifying transistor 11 and the biasing transistor 12, the operating point of the source follower circuit will be described. For more detail, a case that the voltage $V_{gs1}$ between the gate and the source of the amplifying transistor 11 is the same value as the voltage $V_{gs2}$ between the gate and the source of the biasing transistor 12 will be described by use of FIG. 5B. Then, a case that the voltage $V_{gs1}$ between the gate and the source of the amplifying transistor 11 is a different value which is different from the voltage $V_{gs2}$ between the gate and the source of the biasing transistor 12, and for example, the biasing transistor 12 operates in a linear region will be described by use of FIG. 5C.

In FIG. 5B, a dotted line 21 shows a relation of a voltage and an electric current when the voltage $V_{gs1}$ between the gate and the source of the amplifying transistor 11 is $V_b$, and a solid line 22 shows a relation of a voltage and a electric current when the voltage $V_{gs2}$ between the gate and the source of the biasing transistor 12 is $V_b$. Also, in FIG. 5C, a dotted line 21 shows a relation of a voltage and a electric current when the voltage $V_{gs1}$ between the gate and the source of the amplifying transistor 11 is $V_b'$, and a solid line 22 shows a relation of a voltage and a electric current when the voltage $V_{gs2}$ between the gate and the source of the biasing transistor 12 is $V_b$.

In FIG. 5B, since the voltage $V_{gs1}$ between the gate and source of the amplifying transistor 11 and the voltage $V_{gs2}$ between the gate and the source of the biasing transistor 12 are the same values and further, the bias electric potential $V_b$ and the voltage $V_{gs2}$ between the gate and the source of the biasing transistor 12 are the same value, the voltage $V_{gs1}$ between the gate and the source of the amplifying transistor 11 is the same value as the bias electric potential $V_b$. That is, $V_{gs1}=V_{gs2}=V_b$ is achieved, and as shown in FIG. 5B, the amplifying transistor 11 and the biasing transistor 12 operate in the saturation region. At this time, a relation of the input electric potential $V_{in}$ and the output electric potential $V_{out}$ becomes linear.

On the other hand, in FIG. 5C, the voltage $V_{gs1}$ between the gate and the source of the amplifying transistor 11 is a different value which is different from the voltage $V_{gs2}$ between the gate and the source of the biasing transistor 12. Then, the voltage $V_{gs2}$ between the gate and the source of the biasing transistor 12 is the same value as the bias electric potential $V_b$. Also, it is assumed that the voltage $V_{gs1}$ between the gate and the source of the amplifying transistor 11 is a bias electric potential $V_b'$. In sum, $V_{gs2}=V_b$ and $V_{gs1}=V_b'$ are satisfied, and as shown in FIG. 5C, the amplifying transistor 11 operates in the saturation region, and the biasing transistor 12 operates in the linear region. At this time, a relation of the input electric potential $V_{in}$, the output electric potential $V_{on}$, and the bias electric potential $V_b'$ satisfies the following equation (3).

$$V_{out}=V_{in}-V_b' \qquad (3)$$

If it is assumed that an electric current flowing when the biasing transistor 12 operates in the linear region is Ib', Ib'<Ib is satisfied. In sum, $V_b'<V_b$ is satisfied, and values of both the input electric potential $V_{in}$ and the electric current Ib' are lessened. Then, the bias electric potential $V_b'$ is also lessened. At this time, a relation of the input electric potential $V_{in}$ and the output electric potential $V_{out}$ becomes non-linear.

Summarizing the foregoing, in the source follower circuit in the steady state, in order to enlarge an amplitude of the output electric potential $V_{out}$, it is desirable that the bias electric potential $V_b$ is lessened. This is because of the following two reasons.

A first reason is that, as shown in Equation (2), when the bias electric potential $V_b$ is small, the output electric potential $V_{out}$ can be enlarged. A second reason is that, in case that a value of the bias electric potential $V_b$ is large, when the input electric potential $V_{in}$ is lessened, the biasing transistor 12 operates in the linear region. When the biasing transistor 12 operates in the linear region, the relation of the input electric potential $V_{in}$ and the output electric potential $V_{out}$ is apt to become non-linear.

In addition, since it is necessary that the biasing transistor 12 is in a conductive state, it is necessary to set a value of the bias electric potential $V_b$ to be a value which is larger than the threshold voltage of the biasing transistor 12.

The operation of the source follower circuit in the steady state has been described until this point and, subsequently, an operation of the source follower circuit in the transient state will be described by use of FIGS. 6A-B.

The source follower circuit shown in FIGS. 6A-B is of a structure which was designed by adding a capacity device 15 to the circuit of FIG. 5A. One terminal of the capacity device 15 is connected to the source region of the amplifying transistor 11, and the other terminal is connected to a power supply line 16. A ground electric potential $V_{ss}$ is applied to the power supply line 16.

An electric potential difference between both electrodes of the capacity device 15 becomes identical to the output electric potential $V_{out}$ of the source follower circuit. Here, by use of FIG. 6A, an operation in case of $V_{out}<V_{in}-V_b$ will be described, and then, by use of FIG. 6B, an operation in case of $V_{out}>V_{in}-V_b$ will be described.

Firstly, by use of FIG. 6A, an operation of the source follower circuit in the steady state in case of $V_{out}<V_{in}-V_b$ will be described.

In FIG. 6A, at a time point of t=0, a value of the voltage $V_{gs1}$ between the gate and the source of the amplifying transistor 11 is larger than a value of the voltage $V_{gs2}$ between the gate and the source of the biasing transistor 12. Therefor, a large electric current flows through the amplifying transistor 11 and electric charge is rapidly held in the capacity device 15. Then, the output electric potential $V_{out}$ is enlarged, and a value of the voltage $V_{gs1}$ between the gate and the source of the amplifying transistor 11 is reduced.

Then, based upon the passage of time (t=$t_1$, $t_1>0$), when the voltage $V_{gs1}$ between the gate and the source of the amplifying transistor 11 becomes equal to the bias electric potential $V_b$, it falls in the steady state. At this time, the relation of the output electric potential $V_{out}$, the input electric potential $V_{in}$ and the bias electric potential $V_b$ satisfy the above-described Equation (2).

Summarizing the foregoing, in case of $V_{out}<V_{in}-V_b$, since the voltage $V_{gs1}$ between the gate and the source of the amplifying transistor 11 is larger than the bias electric potential $V_b$, a large electric current flows through the amplifying transistor 11, and electric charge is rapidly held in the capacity device 15. Therefor, time for holding a predetermined electric charge in the capacity device 15, in other words, time necessary for writing a signal to the capacity device 15 may be shortened.

Then, by use of FIG. 6B, an operation of the source follower circuit in the transient state in case of $V_{out}>V_{in}-V_b$ will be described.

In FIG. 6B, at a time point of t=0, the voltage $V_{gs1}$ between the gate and the source of the amplifying transistor 11 is of a smaller value than the threshold voltage of the amplifying transistor 11. Therefor, the amplifying transistor 11 is in a non-conductive state. Then, electric charges which were stored in the capacity device 15 flow in a direction of the ground electric potential $V_{ss}$ through the biasing transistor 12, and are finally discharged. At this time, since the voltage $V_{gs2}$ between the gate and the source of the biasing transistor 12 is the same value as the bias electric potential $V_b$, a electric current flowing through the biasing transistor 12 becomes Ib.

Then, based upon the passage of time (t=$T_1$, $t_1>0$), the output electric potential $V_{out}$ is lessened, and the voltage $V_{gs1}$ between the gate and the source of the amplifying transistor 11 is enlarged. Then, when the voltage $V_{gs1}$ between the gate and the source of the amplifying transistor 11 becomes equal to the bias electric potential $V_b$, it falls in the steady state. At this time, the relation of the output electric potential $V_{out}$, the input electric potential $V_{in}$ and the bias electric potential $V_b$ satisfies the above-described Equation (2). In addition, in the steady state, the output electric potential $V_{out}$ is maintained to be a constant value, and electric charges do not flow through the capacity device 15. Then, the electric current Ib flows through the amplifying transistor 11 and the biasing transistor 12.

Summarizing the foregoing, in case of $V_{out}>V_{in}-V_b$, time for holding a predetermined electric charge in the capacity device 15, in other words, time for writing a signal to the capacity device 15 is dependent upon the electric current $I_b$ flowing through the biasing transistor 12. Then, the electric current $I_b$ is dependent upon the bias electric potential $V_b$. Accordingly, in order to shorten the time for writing the signal to the capacity device 15 by enlarging the electric current $I_b$, there occurs a necessity to enlarge the bias electric potential $V_b$.

In addition, as a method for compensating variation of a threshold voltage of a transistor, there is a method that the compensation is carried out by viewing the variation by an output of a circuit to which a signal was inputted and thereafter, by giving feed back of the variation to an input side (e.g., see, Non-Patent Document 1).

[Non-Patent Document 1] H. Sekine et al, "Amplifier Compensation Method for a Poly-Si TFT LCLV with an Integrated Data-Driver", IDRC'97, p. 45-48.

The operation of the above-described source follower circuit is carried out on the assumption that characteristics of the amplifying transistor 11 and the biasing transistor 12 are the same. However, as for the both transistors, overlapped are factors such as variations of gate length (L), gate width (W) and film thickness of a gate insulation film which occur due to difference of manufacturing processes and substrates used and variations of crystalline states of channel forming areas and so on and thereby, there occurs a variation of threshold voltage and mobility of the transistors.

For example, in FIG. 5A, it is assumed that the threshold voltage of the amplifying transistor 11 is 3V; and the threshold voltage of the biasing transistor 12 is 4V, and a variation of 1V occurred. Then, in order to flow the electric current $I_b$, there occurs a necessity that a voltage which is 1V lower than the voltage $V_{gs2}$ between the gate and the source of the biasing transistor 12 to the voltage $V_{gs1}$ between the gate and the source of the amplifying transistor 11. In sum, $V_{gs1}=V_b-1$ is satisfied. Then, $V_{out}=V_{in}-V_{gs1}=V_{in}-V_b+1$ is satisfied. In sum, when there occurs a variation of even 1V in the threshold voltages of the amplifying transistor 11 and the biasing transistor 12, a variation occurs also in the output electric potential $V_{out}$.

SUMMARY OF THE INVENTION

This invention is one which was made in view of the above-described problems, and has an assignment to provide an electric circuit in which affect of a characteristic variation of a transistor was suppressed. For more detail, it has an assignment to provide an electric circuit which can suppress the affect of the characteristic variation of the transistor and can supply a desired voltage, in an electric circuit having a function for amplifying an electric current.

BRIEF DESCRIPTION OF THE DRAWINGS

The invention, together with further advantages thereof, may best be understood by reference to the following description taken in conjunction with the accompanying drawings in which:

FIGS. 10A-B are views for showing an operational amplifier of the invention;

FIG. 11A and FIG. 11B are views for showing the operational amplifier of the invention;

FIG. 13 is a view for showing pixels and a biasing circuit of the semiconductor apparatus of the invention;

FIG. 15 is a view of a signal line drive circuit of the invention;

DETAILED DESCRIPTION OF THE INVENTION

This invention uses an electric circuit of a structure shown below, in order to solve the above-described problems.

Figure 4A:
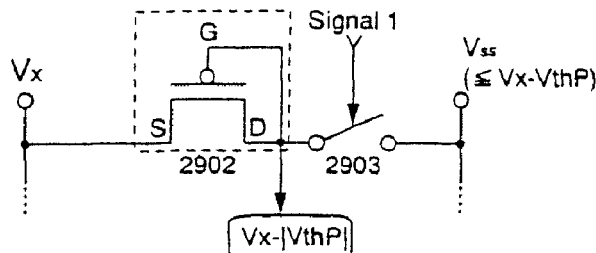
FIGS. 4A-E are views for explaining a structure of an electric circuit of the invention and its operation.
Figure 4B:
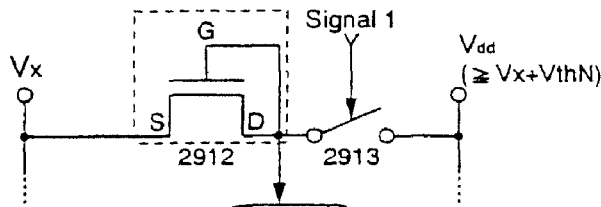

Firstly, a structure of an electric circuit which is used in the invention will be described by use of FIGS. 4A and 4B. In FIGS. 4A and 4B, reference numeral 2903 and 2913 designate devices having switching functions, and preferably, a semiconductor device such as an analog switch which is configured by a transistor etc. is used. The switches 2903, 2913 are controlled by Signal 1 to be turned On or OFF. In addition, the switches 2903, 2913 are simple switches, and their polarity is not limited in particular.

Reference numeral 2902 and 2912 designates rectification type devices (rectifying device). The rectification type device means a device which generates an electric current only in a single direction when an electric potential difference was applied to electrodes at both ends of the device. As the rectification type device, a diode, a TFT in which a gate and a drain are connected etc. are cited. In addition, in this specification, TFT in which the gate and the drain was connected is described as a TFT of diode connection. Then, in FIGS. 4A and 4B, the rectification type device 2902 is a p-channel type transistor of diode connection, and the rectification type device 2912 is a n-channel type transistor of diode connection. Then, in the invention, an electric circuit in which the rectification type device 2902 and the switch 2903 shown in FIG. 4A were connected, or an electric circuit in which the rectification type device 2912 and the switch 2913 shown in FIG. 4B were connected, is used.

Figure 4C:
Figure 4D:
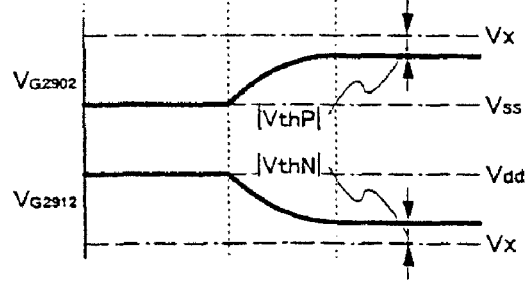

Here, an operation of the electric circuit shown in FIGS. 4A and 4B will be described by use of FIGS. 4C and 4D. In addition, FIG. 4C shows a timing chart of the Signal 1. Also, FIG. 4D shows a relation of a voltage between a gate and a source and time when electric potentials of gates of the TFTs 2902 and 2912 are assumed to be $V_{G2902}$, $V_{G2912}$, respectively.

Here, it is assumed that a certain signal is inputted from one end of the electric circuit and a certain constant electric potential is applied to the other end of the electric circuit. In case of the electric circuit shown in FIG. 4A, it is assumed that the signal to be inputted is $V_x$, the constant electric potential is $V_{ss}(\leq V_x-|V_{thP}|$: $V_{thP}$ means a threshold voltage of TFT 2902). In case of the electric circuit shown in FIG. 4B, it is assumed that the signal to be inputted is $V_x$ and the constant electric potential is $V_{dd}(\leq V_x+|V_{thN}|$: $V_{thN}$ means a threshold voltage of TFT 2912).

Firstly, in a period shown by (i), the switches 2903 and 2913 are turned ON. Then, in the electric circuit shown in FIG. 4A, electric potentials of the drain region and the gate electrode of the transistor 2902 are decreased. In the electric circuit shown in FIG. 4B, electric potentials of the drain region and the gate electrode of the transistor 2912 are increased. Since, as for the transistors 2902, 2912, a voltage between both electrodes of each transistor exceeds an absolute value of the threshold voltage, they are ON.

Then, in a period shown by (ii), the switches 2903, 2913 are turned OFF. Then, the drain electric potential of the TFT 2902 is increased, and the drain electric potential of the TFT 2912 is decreased.

Later on, in a period shown by (iii), the voltage between the gate and the source of the TFT 2902, 2912 becomes equal to its threshold voltage and both of the TFTs 2902, 2912 are turned OFF. At this time, a drain electric potential of the TFT 2902, 2912 becomes $V_x-|V_{thP}|$, $V_x+|V_{thN}|$, respectively. That is, it means that, by the TFTs 2902, 2912, an operation for adding there threshold voltage on the electric potential $V_x$ of the signal to be inputted is carried out.

As described above, this invention provides an electric circuit using a rectification type device which generates an electric current only in a single direction when an electric potential difference was applied to electrodes at both end of the device. Then, the invention utilizes a fact that, when a signal voltage is inputted to one terminal of the rectification type device, an electric potential of the other terminal becomes an electric potential offset only by the threshold voltage of the rectification type device.

In sum, even if a variation of the threshold voltage occurs between the rectification type devices, the rectification type device can always provide an electric potential which was offset only by the threshold voltage of the rectification type device. Then, the invention can provide an electric circuit in which affect of a variation of the threshold voltage between the rectification type devices was suppressed, by using the rectification type device.

Figure 4E:
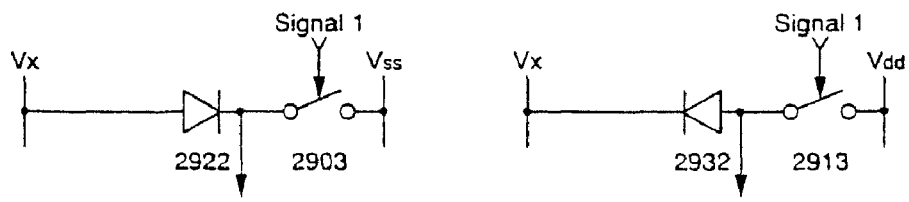
Figure 5A:
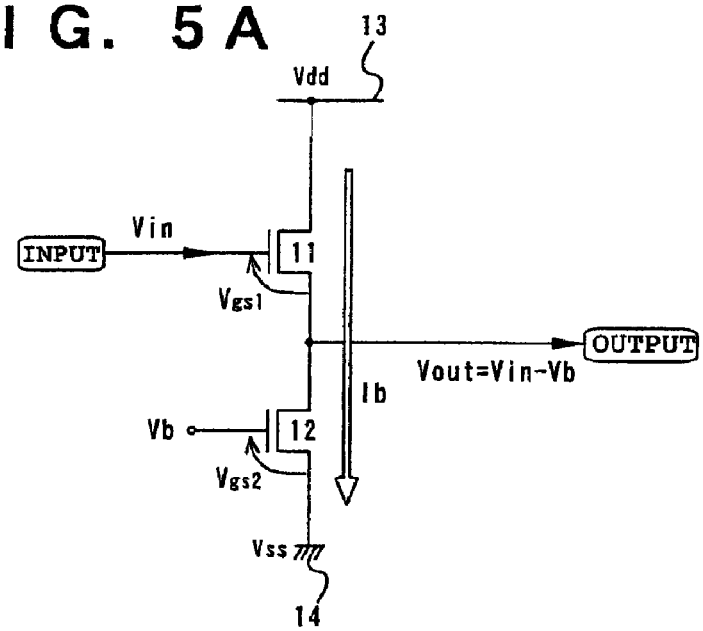
FIGS. 5A-C are views for explaining an operation of a source follower circuits.
Figure 5B:
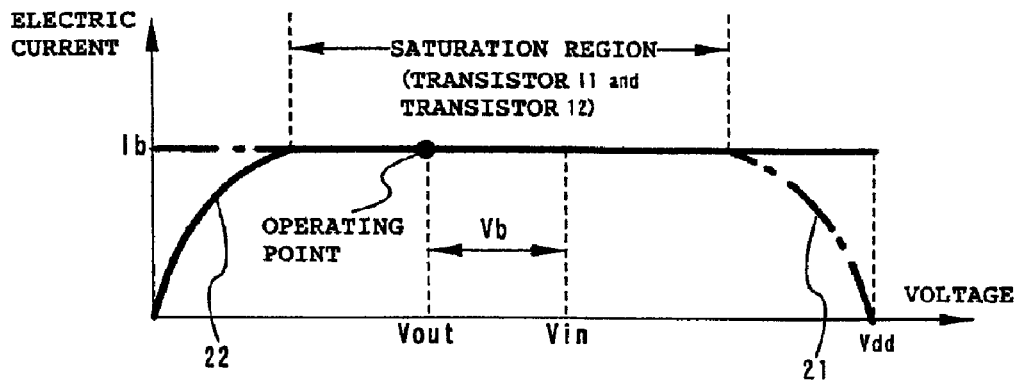
Figure 5C:
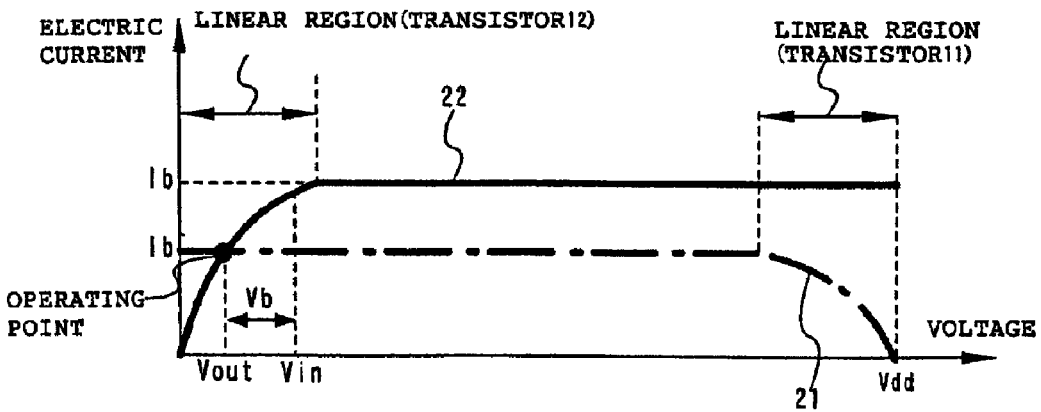
Figure 6A:
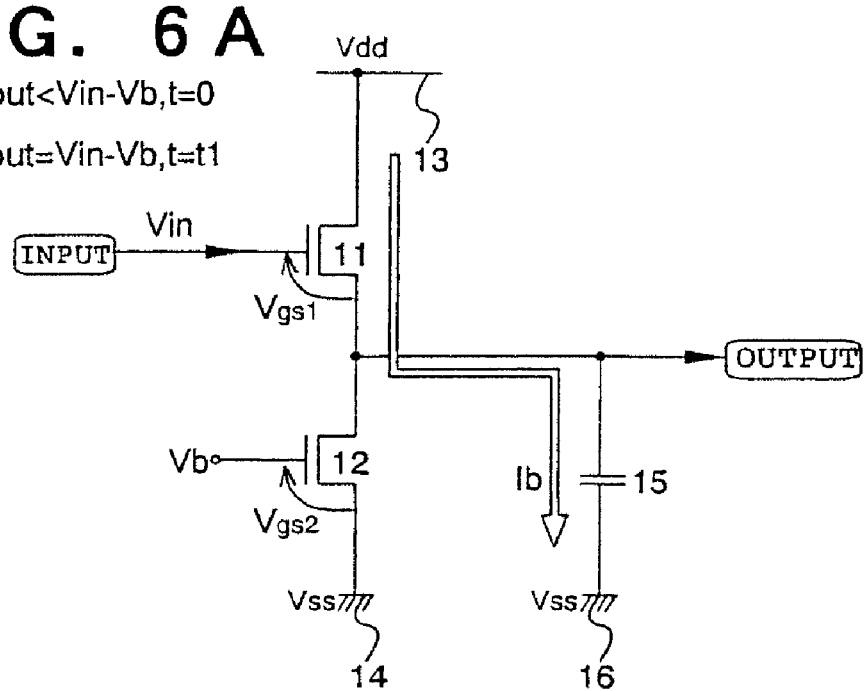
FIG. 6A and FIG. 6B are views for explaining the operation of the source follower circuits.
Figure 6B:
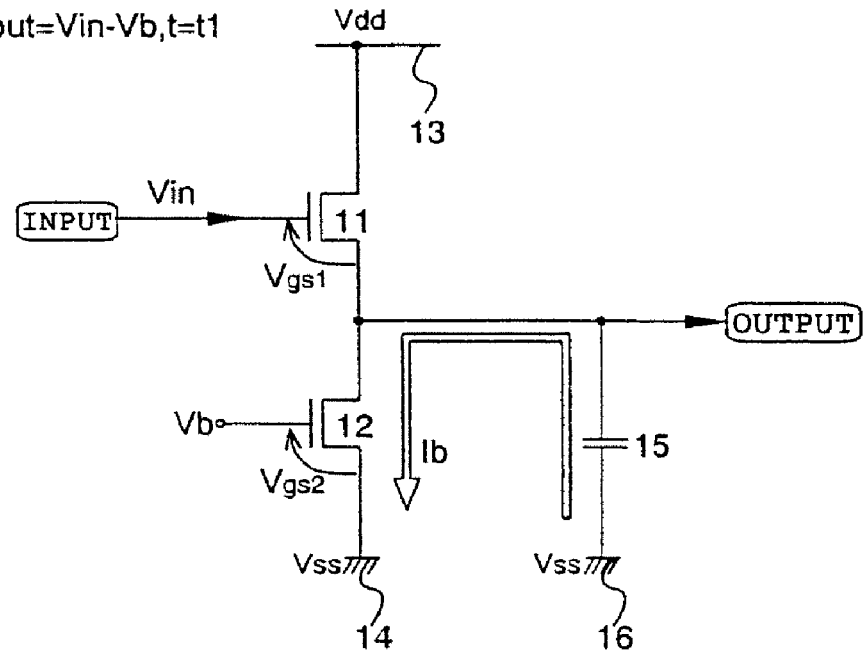

In addition, polarity of the TFTs 2902, 2912 is not limited in particular. Also, in place of the TFTs 2902, 2912, as shown in FIG. 4E, diodes 2922, 2932 may be used respectively. As for the diodes 2922, 2932, besides a diode having an ordinary PN junction, can use a diode of a well-known structure.

In addition, in the invention, a transistor which used any material and a transistor which went through any means and manufacturing methods may be used, and also, any types of transistors may be used. For example, a thin film transistor (TFT) may be used. As the TFT, any semiconductor layer of amorphous, polycrystalline, or single crystalline may be used. As other transistors, a transistor which was formed on a single crystalline substrate may be used, and a transistor which was formed on a SOI substrate may be used. Also, a transistor which was formed by an organic material and a carbon nanotube may be used. Further, a MOS type transistor may be used and a bipolar type transistor may be used.

Embodiment Mode 1

In this embodiment mode, as one example of an electric circuit of the invention, a source follower circuit is shown and its structure and operation will be described by use of FIGS. 1A to 3B.

Firstly, the structure of the source follower circuit will be described by use of FIGS. 1A to 3B.

In FIGS. 1A to 3B, 411 designates an amplifying transistor, and 412 designates a biasing transistor. 413 and 414 designates rectification type devices, and in this embodiment mode, transistors are used for them. Then, it is assumed that a threshold voltage of the transistor 413 is $V_{th1}$ and a threshold voltage of the transistor 414 is $V_{th2}$, 415 and 416 designate devices having switching functions, and preferably, analog switches configured by transistors are used for them. In addition, the switches 415, 416 are simple switches, and its polarity is not limited in particular.

Figure 1A:
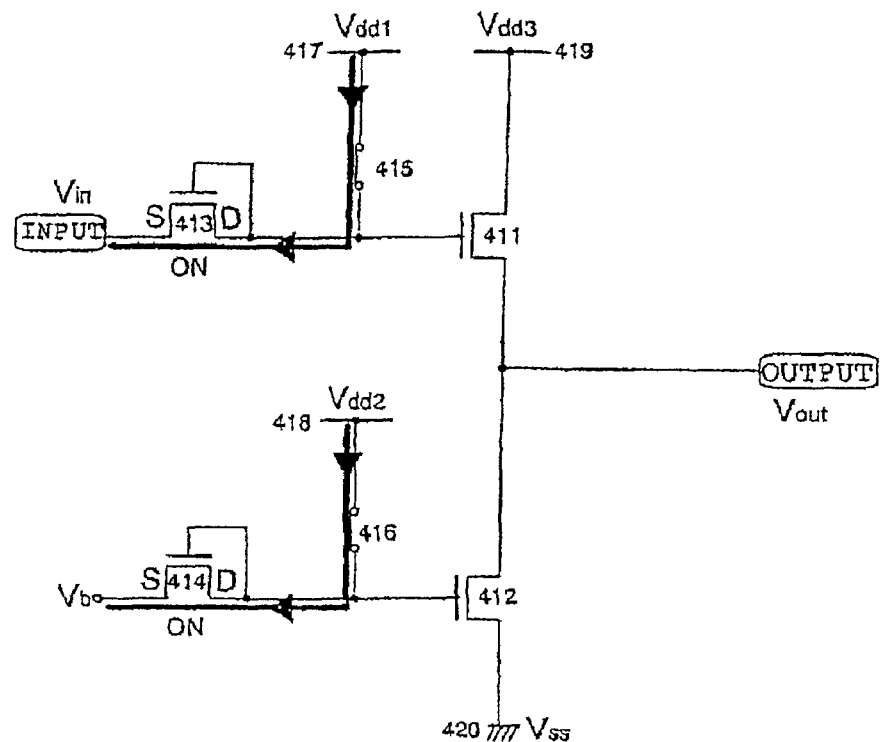
FIG. 1A and FIG. 1B are views for explaining an operation of a source follower circuits of the invention.
Figure 1B:
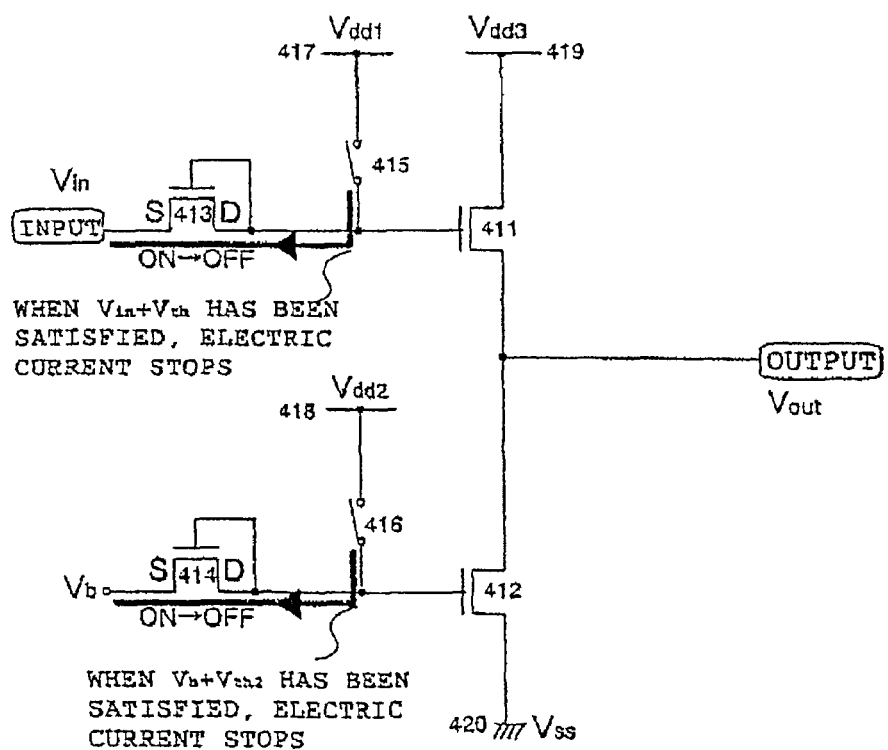
Figure 2A:
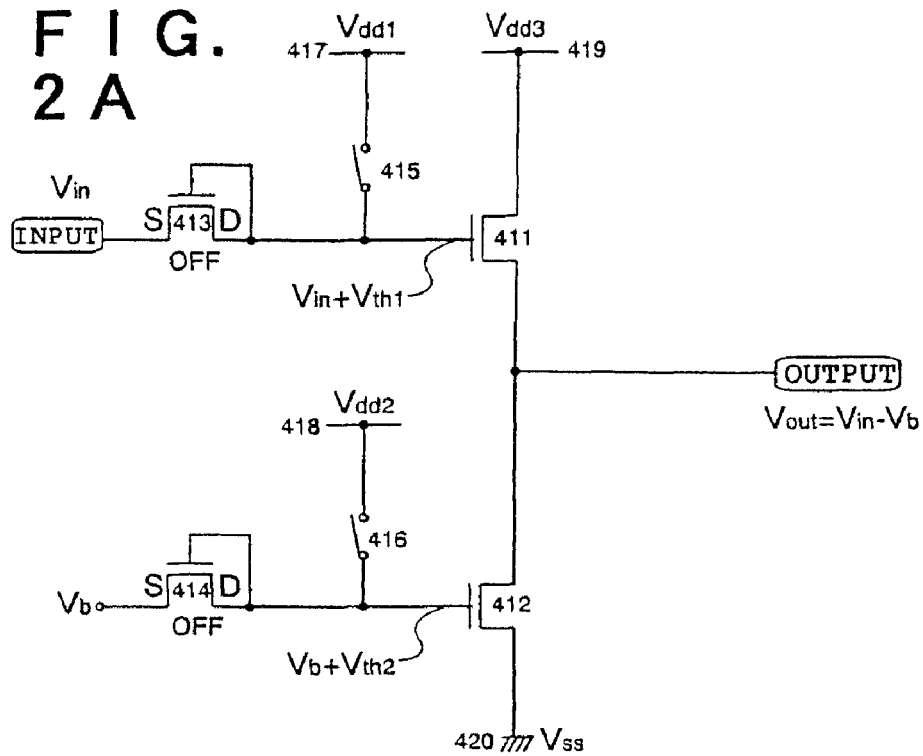
FIG. 2A and FIG. 2B are views for explaining the operation of the source follower circuits of the invention.
Figure 2B:
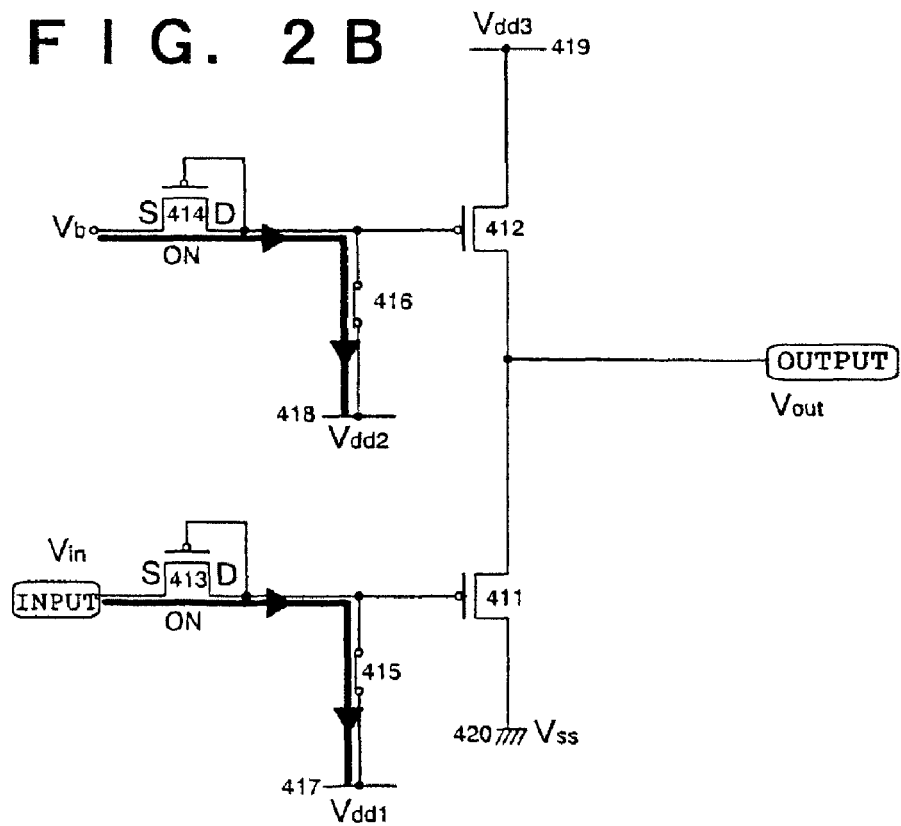
Figure 3A:
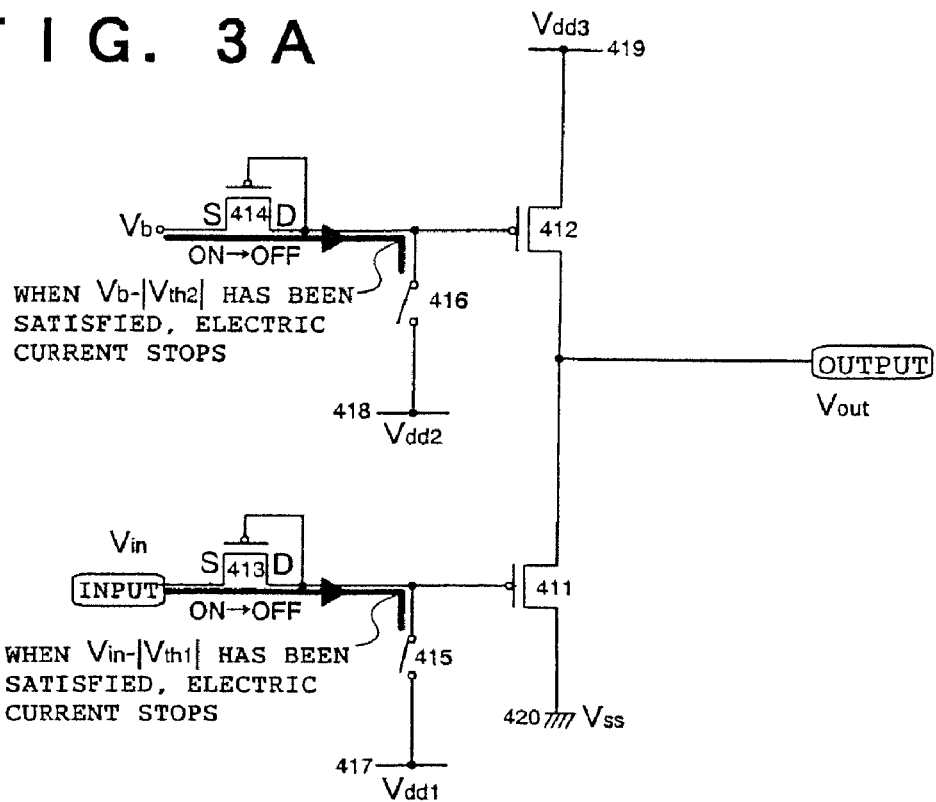
FIG. 3A and FIG. 3B are views for explaining the operation of the source follower circuits of the invention.
Figure 3B:
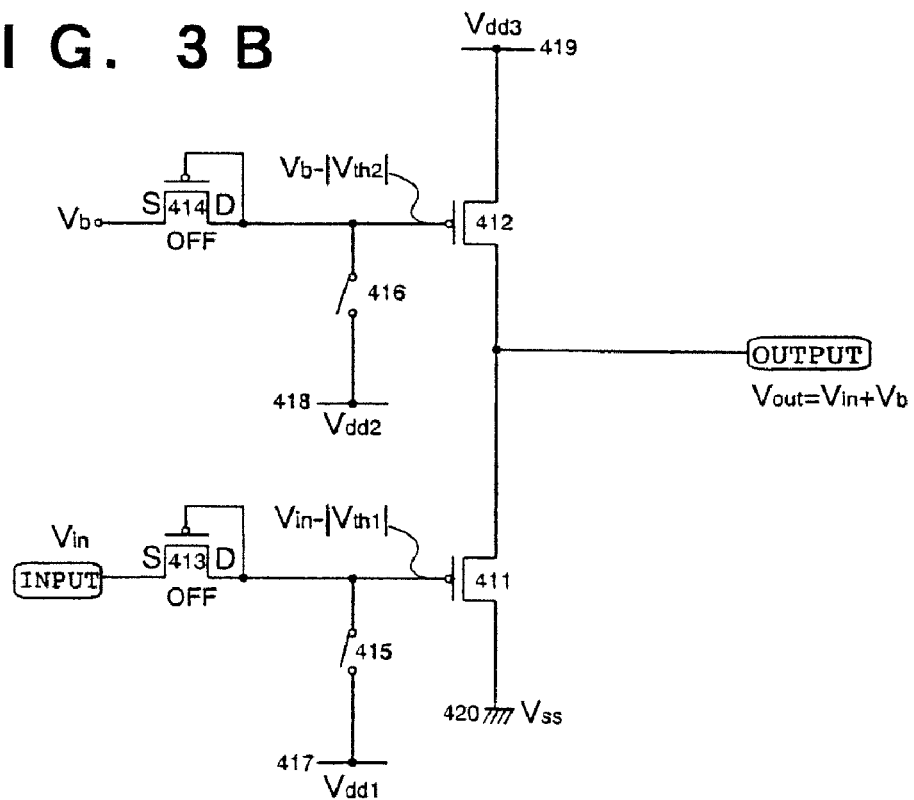

In addition, polarity of the transistors 411 to the transistor 413 is not limited in particular but, it is preferable that the transistor 411 and the transistor 412, the transistor 411 and the transistor 413, the transistor 412 and the transistor 414 have the same polarity. Then, FIGS. 1A and 1B and 2A show a source follower circuit in which the transistor 411 to the transistor 414 are of n-channel type. Then, FIGS. 2B and 3A-B show a case that the transistor 411 to the transistor 414 are of p-channel type.

A drain region of the amplifying transistor 411 is connected to a power supply line 419, and a source region thereof is connected to a power supply line 420 through the transistor 412. A gate electrode of the amplifying transistor 411 is connected to a gate electrode and a drain region of the transistor 413. In addition, hereinafter, the amplifying transistor 411 is identified as the transistor 411.

A drain region of the biasing transistor 412 is connected to the power supply line 419 through the transistor 411, and a source region thereof is connected to the power supply line 420. A gate electrode of the biasing transistor 412 is connected to a gate electrode and a drain region of the transistor 414. In addition, hereinafter, the biasing transistor 412 is identified as the transistor 412.

The switches 415, 416 are controlled by a signal which is inputted to be turned ON or OFF. However, for the purpose of simplifying descriptions, an signal line etc. for inputting a signal to the switches 415, 416 are omitted and not shown in the drawings.

Then, in the source follower circuit shown in FIGS. 1A to 3B, an input electric potential $V_{in}$ is inputted to the source region of the transistor 413. Also, a bias electric potential is inputted to the source region of the transistor 414. Then, an electric potential of the source region of the transistor 411 becomes an output electric potential $V_{out}$.

Reference numeral 417 to 420 designate power supply lines, and a power supply electric potential $V_{dd1}$ is applied to the power supply line 417, and a power supply electric potential $V_{dd2}$ is applied to the power supply line 418. Also, a power supply electric potential $V_{dd3}$ is applied to the power supply line 419, and a ground electric potential $V_{ss}$ is applied to the power supply line 420. In addition, there is a necessity that the power supply electric potential $V_{dd1}$ and the power supply electric potential $V_{dd2}$ satisfy the following conditions.

Firstly, as shown in FIGS. 1A, 1B and 2A, in case that the transistor 411 to the transistor 413 are of n-channel type, there is a necessity that the power supply electric potential $V_{dd1}$ is an electric potential which is more than an added value of the input electric potential $V_{in}$ and the threshold voltage $V_{th1}$ of the transistor 413. At this time, the following equation (4) is satisfied.

$$V_{dd1} \geq (V_{in} + V_{th1}) \quad (4)$$

In the same manner, there is a necessity that the power supply electric potential $V_{dd2}$ is an electric potential which is more than an added value of the bias electric potential $V_b$ and the threshold voltage $V_{th2}$ of the transistor 414. At this time, the following equation (5) is satisfied.

$$V_{dd2} \geq (V_b + V_{th2}) \quad (5)$$

Further, as shown in FIGS. 2B and 3A-B, in case that the transistor 411 to the transistor 413 are of p-channel type, there is a necessity that the power supply electric potential $V_{dd1}$ is an electric potential which is less than a value obtained by subtracting an absolute value of the threshold voltage $V_{th1}$ of the transistor 413 from the input electric potential $V_{in}$. At this time, the following equation (6) is satisfied.

$$V_{dd1} \leq (V_{in} - |V_{th1}|) \quad (6)$$

In the same manner, there is a necessity that the power supply electric potential $V_{dd2}$ is an electric potential which is less than a value obtained by subtracting an absolute value of the threshold voltage $V_{th2}$ of the transistor 414 from the bias electric potential $V_b$. At this time, the following equation (7) is satisfied.

$$V_{dd2} \leq (V_b - |V_{th2}|) \quad (7)$$

In addition, one common power supply line may be used for the power supply line 417 to the power supply line 419. However, at that time, it is necessary to apply an electric potential which satisfies the Equations (4) and (5). In the same manner, it is necessary to apply an electric potential which satisfies the Equations (6) and (7).

Subsequently, an operation of the source follower circuit shown in FIGS. 1A to 3B will be described. Firstly, a case that the transistor 411 to the transistor 413 are of n-channel type will be described by use of FIGS. 1A, 1B and 2A. Then, a case that the transistor 411 to the transistor 413 are of p-channel type will be described by use of FIGS. 2B, 3A and 3B.

In FIG. 1A, the input electric potential $V_{in}$ is applied to the source region of the transistor 413, and also, the bias electric potential $V_b$ is applied to the source region of the transistor 414. Then, the switches 415, 416 are turned ON. Then, there occurs an electric potential difference at the power supply line 417 and the source region of the transistor 413, an electric current flows. In the same manner, there occurs an electric potential difference at the power supply line 418 through the source region of the transistor 414, and an electric current flows. At this time, an electric potential of the gate electrode of the transistor 413 becomes the same value as the power supply electric potential $V_{dd1}$, and an electric potential of the gate electrode of the transistor 414 becomes the same value as the power supply electric potential $V_{dd2}$.

Then, the switches 415, 416 are turned OFF (FIG. 1B). Then, electric potentials of the drain regions of the transistors 413, 414 are decreased. Later on, voltages between the gates and the sources of the transistors 413, 414 becomes equal to the threshold voltages $V_{th1}$, $V_{th2}$ of the transistors 413, 414. As a result, the transistors 413, 414 are turned OFF together.

At this time, the drain electric potential of the transistor 413 is $V_{in} + V_{th1}$. Also, the drain electric potential of the transistor 414 is $V_b + V_{th2}$ (FIG. 2A). Then, an electric potential of the source region of the transistor 411 becomes $V_{out}$. The output electric potential $V_{out}$ is calculated by the following equations (8) to (15).

When the transistor operates in the saturation state, the following equation (8) is satisfied. $I_{ds}$ designates an amount of an electric current which flows through a channel forming area of a transistor, and $V_{gs}$ designates a voltage between a gate and a source of a transistor. Also, $V_{th}$ designates a threshold voltage of a transistor.

$$I_{ds} \propto (V_{gs} - V_{th})^2 \quad (8)$$

In the above equation (8), assuming $V_k = V_{gs} - V_{th}$, the following equation (9) is satisfied.

$$I_{ds} \propto V_k^2 \quad (9)$$

It is known from the equation (9) that $I_{ds}$ is in proportion to the second power of $V_k$ which is a value obtained by subtracting a value of $V_{th}$ from $V_{gs}$. Here, by applying the above-described equations (8) and (9) to the transistors 411, 412, the output electric potential $V_{out}$ is calculated. Firstly, assuming that a voltage applied to the gate electrode of the transistor 412 is $V_{a2}$, the following equation (10) is satisfied.

$$V_{a2} = V_b + V_{th2} \quad (10)$$

Then, it is assumed that the threshold voltages of the transistors 412 and 414 are the same. Then, assuming that a value obtained by subtracting the threshold voltage $V_{th2}$ from the voltage $V_{a2}$ which was applied to the gate electrode of the transistor 412 is $V_{k2}$, the following equation (11) is satisfied.

$$V_{k2} = V_{a2} - V_{th2} = (V_b + V_{th2}) - V_{th2} = V_b \quad (11)$$

Also, assuming that a voltage applied to the gate electrode of the transistor 411 is $V_{a1}$, the following equation (12) is satisfied.

$$V_{a1} = V_{in} + V_{th1} \quad (12)$$

It is assumed that the threshold voltages of the transistors 413 and 411 are the same. Then, assuming that a value obtained by subtracting the threshold voltage $V_{th1}$ from the voltage $V_{gs1}$ between the gate and the source of the transistor 411 is $V_{k1}$, the following equation (13) is satisfied.

$$V_{k1} = V_{gs1} - V_{th1} \quad (13)$$

Here, considering that electric currents of the same amount flow through the transistors 411, 412, the following equation (14) is satisfied. In addition, in this embodiment mode, for the purpose of simplicity, it is assumed that the transistors 411 and 412 have the same size such as gate widths, gate lengths etc.

$$V_{k1} = V_{k2} = V_b \quad (14)$$

Then, since the output electric potential $V_{out}$ is an electric potential of the source region of the transistor 211, the following equation (15) is satisfied.

$$V_{out} = V_{a1} - V_{gs1} = (V_{in} + V_{th1}) - (V_b + V_{th1}) = V_{in} - V_b \quad (15)$$

As shown in the equation (15), the output electric potential $V_{out}$ becomes a value obtained by subtracting the bias electric potential $V_b$ from the input electric potential $V_{in}$, and is not dependent upon the threshold voltage. Therefor, even if there occurs a variation of the threshold voltages of the transistors 411, 415, it is possible to suppress an affect to the output electric potential $V_{out}$.

Then, the case that the transistors 411 to 413 are of p-channel type will be described by use of FIGS. 2B and 3.

In FIG. 2B, the input electric potential $V_{in}$ is applied to the source region of the transistor 413, and also, the bias electric potential $V_b$ is applied to the source region of the transistor 414. Then, the switches 415, 416 are turned ON. Then, there occurs an electric potential difference at the source region of the transistor 413 and the power supply line 417, and an electric current flows. In the same manner, there occurs an electric potential difference at the source region of the transistor 414 and the power supply line 418, and an electric current flows. Then, an electric potential of the gate electrode of the transistor 413 becomes the same value as the power supply electric potential $V_{dd1}$, and an electric potential of the gate electrode of the transistor 414 becomes the same value as the power supply electric potential $V_{dd2}$.

Then, the switches 415, 416 are turned OFF (FIG. 3A). Then, electric potentials of the drain regions of the transistors 413, 414 are increased. Later on, voltages between gates and sources of the transistors 413, 414 become equal to the threshold voltages $V_{th1}$, $V_{th2}$ of the transistors 413, 414. As a result, the transistors 413, 414 are turned OFF together.

At this time, the drain electric potential of the transistor 413 is $(V_{in}-|V_{th1}|)$. Also, the drain electric potential of the transistor 414 is $(V_b-|V_{th2}|)$ (FIG. 3B). Then, an electric potential of the source region of the transistor 411 becomes the output electric potential. The output electric potential is calculated by the following equations (16) to (21)

Firstly, in reference to the above equations (8), (9), assuming that a voltage applied to the gate electrode of the transistor 412 is $V_{a2}$, the following equation (16) is satisfied.

$$V_{a2}=V_b-|V_{th2}| \quad (16)$$

Further, assuming that a value obtained by subtracting the threshold voltage $V_{th2}$ from the voltage $V_{a2}$ applied to the gate electrode of the transistor 412 is $V_{k2}$, the following equation (17) is satisfied.

$$V_{k2}=V_{a2}-V_{th2}=(V_b-|V_{th2}|)-|V_{th2}|=V_b \quad (17)$$

Also, assuming that a voltage applied to the gate electrode of the transistor 411 is $V_{a1}$, the following equation (18) is satisfied.

$$V_{a1}=V_{in}-|V_{th1}| \quad (18)$$

Further, assuming that a value obtained by subtracting the threshold voltage $V_{th1}$ from the voltage $V_{gs1}$ between the gate and the source of the transistor 411 is $V_{k1}$, the following equation (19) is satisfied.

$$V_{k1}=V_{gs1}-|V_{th1}| \quad (19)$$

Here, considering that electric currents of the same amount flow through the transistors 411, 412, the following equation (20) is satisfied.

$$V_{k1}=V_{k2}=V_b \quad (20)$$

Then, since the output electric potential $V_{out}$ is an electric potential of the source region of the transistor 211, the following equation (21) is satisfied.

$$V_{out}=V_{a1}-V_{gs1}=(V_{in}+V_{th1})-(V_b+V_{th1})=V_{in}-V_b \quad (21)$$

As shown in the equation (21), the output electric potential $V_{out}$ becomes a value obtained by subtracting the bias electric potential $V_b$ from the input electric potential $V_{in}$, and is not dependent upon the threshold voltage. Therefor, even if there occurs a variation of the threshold voltages of the transistors 411, 415, it is possible to suppress an affect to the output electric potential $V_{out}$.

Figure 7A:
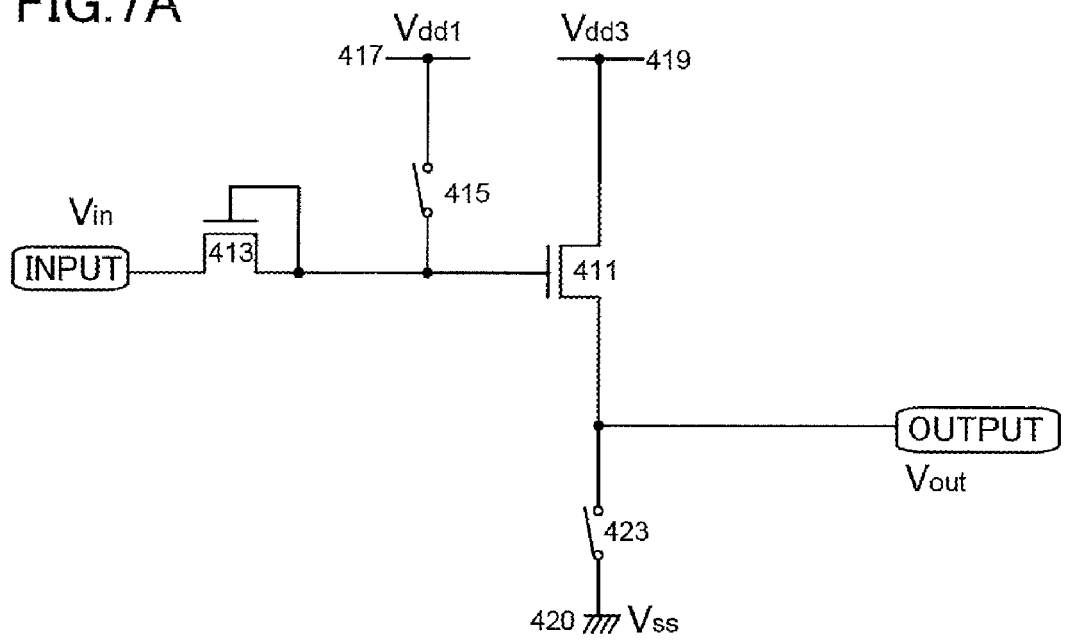
FIG. 7A and FIG. 7B are views for showing the source follower circuit of the invention.

Also, FIG. 7A shows a source follower circuit of such a case that the transistors 412, 414, the switch 416 and the power supply line 418 are not disposed, in the source follower circuit shown in FIGS. 1A-B and 2A. In addition, in the electric circuit shown in FIG. 7A, a switch 423 is additionally disposed between the power supply line 420 and the source region of the transistor 411. Since an operation of the source follower circuit shown in FIG. 7A is the same as the operation of the source follower circuit shown in the above described FIGS. 1A-B and 2A, its description is omitted in this embodiment mode.

Figure 7B:
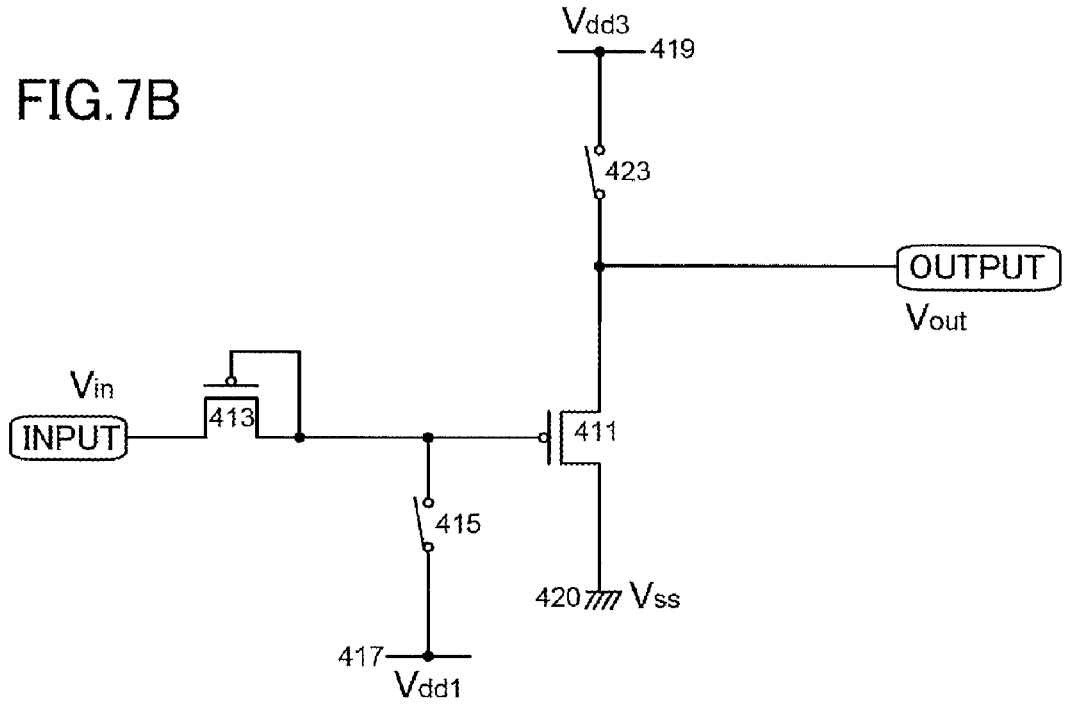

Further, FIG. 7B shows a source follower circuit of such a case that the transistors 412, 414, the switch 416 and the power supply line 418 are not disposed, in the source follower circuit shown in FIGS. 2B and 3A-B. In addition, since an operation of the source follower circuit shown in FIG. 7B is the same as the operation of the source follower circuit shown in the above described FIGS. 2B and 3, its description is omitted in this embodiment mode.

In addition, in this specification, an operation for giving a predetermined electric charge to the rectification type device is called as a setting operation. In this embodiment mode, the operation shown in FIG. 1A and the operation shown in FIG. 2B correspond to the setting operation. An operation for inputting the input electric potential $V_{in}$ and taking out the output electric potential $V_{out}$ is called as an output operation. In this embodiment mode, the operation shown in FIGS. 1B and 2A and the operation shown in FIGS. 3A and 3B correspond to the output operation.

As described above, this invention provides an electric circuit which used the rectification type device through which an electric current flows only in a single direction, when an electric potential difference was applied to electrodes at both end of the device. Then, this invention utilizes a fact that, when a signal electric voltage was applied to one terminal of the rectification type device, an electric potential of the other terminal becomes an electric potential offset by only the threshold voltage of the rectification type device.

In sum, even if there occurs a variation of the threshold voltages between the rectification type devices, the rectification type device can always provide an electric potential offset by only the threshold voltage of the rectification type device. This invention, by using the above-described rectification type device, can provide an electric circuit in which an affect of a variation of the threshold voltages between the rectification type devices was suppressed. Then, to suppress an affect of a variation of the threshold voltages between the rectification type devices corresponds to that it is possible to provide an electric circuit in which an affect of a variation of the threshold voltages between the rectification type devices was suppressed.

Embodiment Mode 2

In the above-described Embodiment Mode 1, the source follower circuit to which this invention was applied was described. However, this invention can be applied to various circuits such as an arithmetic circuit etc, as represented by a differential amplifier, an sense amplifier, an operational amplifier etc. In this embodiment mode, an arithmetic circuit to which the invention was applied will be described by use of FIGS. 8 to 11B.

Firstly, a differential amplifier to which the invention was applied will be described by use of FIG. 8. The differential amplifier carries out a calculation of a difference of an input electric potential $V_{in1}$ and an input electric potential $V_{in2}$, and outputs the output electric potential $V_{out}$.

Figure 8:
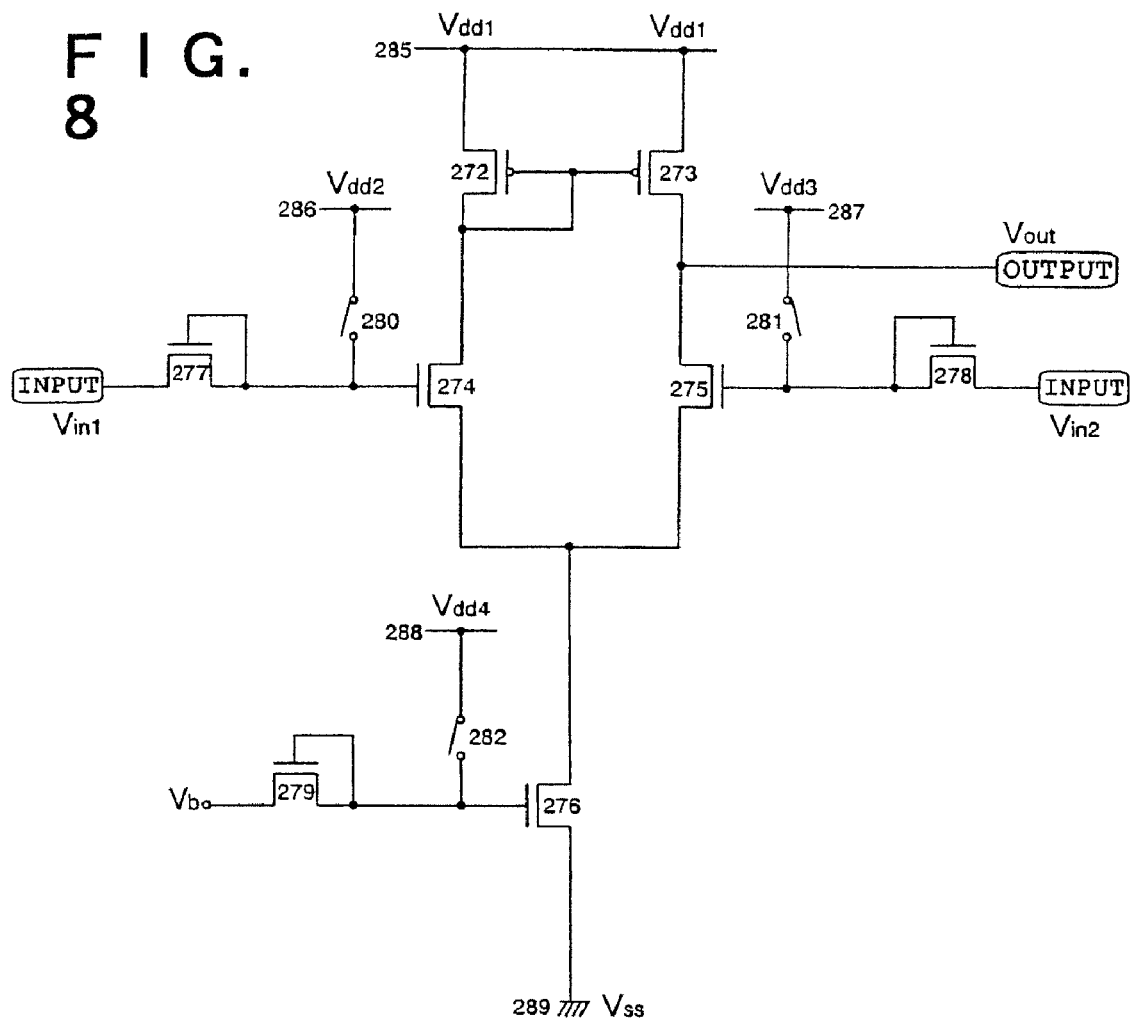
FIG. 8 is a view for showing a differential amplifier of the invention.

In the differential amplifier shown in FIG. 8, reference numeral 272 and 273 designate p-channel type transistors, and reference numeral 274 to 276 designate n-channel type transistors. Reference numeral 277 to 279 designate rectification type devices, and in this embodiment mode, n-channel type transistors are used for them. Also, Reference numeral 280 to 282 designate devices having switching functions, and are indicated as switches. For the switches 280 to 282, preferably, semiconductor devices such as transistors etc. are used. In addition, the switches 280 to 282 are simple switches, and its polarity is not limited in particular.

A drain region of the transistor 272 is connected to a power supply line 285, and a source region thereof is connected to a drain region of the transistor 274. A drain region of the transistor 273 is connected to a power supply line 285, and a source region thereof is connected to a drain region of the transistor 275. A gate electrode of the transistor 272 and a gate electrode of the transistor 273 are connected. In addition, instead of the transistors 272 and 273, resistors may be disposed.

The drain region of the transistor 274 is connected to the power supply line 285 through the transistor 272, and the source region thereof is connected to a power supply line 289 through the transistor 276. A gate electrode of the transistor 274 is connected to a gate electrode of the transistor 277.

The drain region of the transistor 275 is connected to the power supply line 285 through the transistor 273, and the source region thereof is connected to the power supply line 289 through the transistor 276. A gate electrode of the transistor 275 is connected to a gate electrode of the transistor 278.

The drain region of the transistor 276 is connected to the source region of the transistor 274 and the source region of the transistor 275. The source region of the transistor 276 is connected to the power supply line 289, and the gate electrode thereof is connected to a gate electrode of the transistor 279.

In the differential amplifier shown in FIG. 8, the input electric potential $V_{in1}$ is inputted to the source region of the transistor 277, and the input electric potential $V_{in2}$ is inputted to the source region of the transistor 278. Also, the bias electric potential $V_b$ is inputted to the source region of the transistor 279. Then, an electric potential of the drain region of the transistor 275 becomes the output electric potential $V_{out}$.

Reference numeral 285 to 289 designates power supply lines, and the power supply electric potential $V_{dd1}$ is applied to the power supply line 285, and the power supply electric potential $V_{dd2}$ is applied to the power supply line 286. Also, a power supply electric potential $V_{dd3}$ is applied to the power supply line 287, and a power supply electric potential $V_{dd4}$ is applied to the power supply line 288. Also, the ground electric potential $V_{ss}$ is applied to the power supply line 289. Here, assuming that a threshold voltage of the transistor 277 is $V_{th277}$, and a threshold voltage of the transistor 278 is $V_{th278}$, and a threshold voltage of the transistor 279 is $V_{th279}$, it becomes necessary that respective power supply electric potentials $V_{dd2}$ to $V_{dd4}$ satisfy the following equations (22) to (24).

$$V_{dd2} \geq (V_{in1} + V_{th277}) \qquad (22)$$

$$V_{dd3} \geq (V_{in2} + V_{th278}) \qquad (23)$$

$$V_{dd4} \geq (V_b + V_{th279}) \qquad (24)$$

In addition, one common power supply line may be used for the power supply lines 285 to 288. However, it is necessary to apply an electric potential which satisfies the equations (22) to (24). Also, since a description of an operation of the differential amplifier shown in FIG. 8 accords to the above-described Embodiment Mode 1, it is omitted in this embodiment mode.

Subsequently, a case that a transistor configuring the differential amplifier shown in FIG. 8 has a reverse conductivity type will be described by use of FIG. 9.

Figure 9:
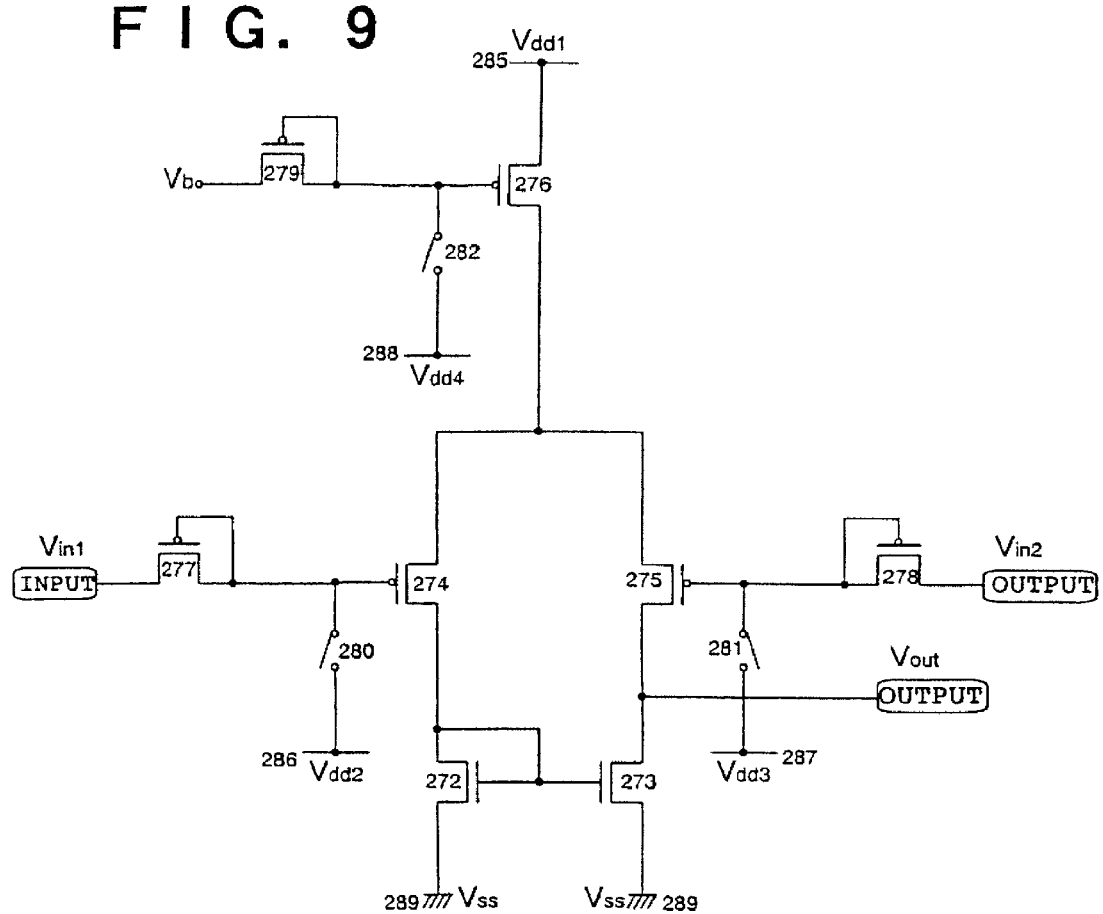
FIG. 9 is a view for showing the differential amplifier of the invention.

In the differential amplifier shown in FIG. 9, Reference numeral 272 and 273 designate n-channel type transistors, and reference numeral 274 to 276 designates p-channel type transistors. Reference numeral 277 to 279 designate rectification type devices, and in this embodiment mode, p-channel type transistors are used for them. Also, reference numeral 280 to 282 designate switches. In addition, since a relation of connections of the transistors 272 to 279 is the same as the above-described differential amplifier shown in FIG. 8, its description is omitted here.

Reference numeral 285 to 289 designates power supply lines, and the power supply electric potential $V_{dd1}$ is applied to the power supply line 285, and the power supply electric potential $V_{dd2}$ is applied to the power supply line 286. Also, a power supply electric potential $V_{dd3}$ is applied to the power supply line 287, and a power supply electric potential $V_{dd4}$ is applied to the power supply line 288. Also, the ground electric potential $V_{ss}$ is applied to the power supply line 289. Here, assuming that a threshold voltage of the transistor 277 is $V_{th277}$, and a threshold voltage of the transistor 278 is $V_{th278}$, and a threshold voltage of the transistor 279 is $V_{th279}$, it becomes necessary that respective power supply electric potentials $V_{dd2}$ to $V_{dd4}$ satisfy the following equations (25) to (27).

$$V_{dd2} \leq (V_{in1} - |V_{th277}|) \qquad (25)$$

$$V_{dd3} \leq (V_{in2} - |V_{th278}|) \qquad (26)$$

$$V_{dd4} \leq (V_b - |V_{th279}|) \qquad (27)$$

In addition, one common power supply line may be used for the power supply lines 285 to 288. However, it is necessary to apply an electric potential which satisfies the equations (25) to (27). Also, since a description of an operation of the differential amplifier shown in FIG. 9 accords to the above-described Embodiment Mode 1, it is omitted in this embodiment mode.

Also, in this embodiment mode, the electric circuit shown in FIGS. 8 and 9 was indicated as the differential amplifier but, this invention is not limited to this, and can be used as another arithmetic circuit such as a sense amplifier etc. by changing a voltage which is inputted as the input electric potential $V_{in1}$ and the input electric potential $V_{in2}$ at pleasure.

Then, an operational amplifier to which this invention was applied will be described by use of FIGS. 10A-B and 11A-B. FIG. 10A shows circuit signs of the operational amplifier, and FIG. 10B shows a circuit structure of the operational amplifier.

In addition, there are various circuit structures of the operational amplifier. Then, in FIGS. 12A-C, a case that the differential amplifier was combined with the source follower circuit as the simplest case will be described. Thereby, a circuit structure of the operational amplifier is not limited to the structure of FIGS. 12A-C.

In the operational amplifier, a characteristic is defined by a relation of the input electric potential $V_{in1}$ and the input electric potential $V_{in2}$, and the output electric potential $V_{out}$. For more detail, the operational amplifier has a function for multiplying a voltage of a difference of the input electric potential $V_{in1}$ and the input electric potential $V_{in2}$ with amplification A and for outputting the output electric potential $V_{out}$.

In the operational amplifier shown in FIG. 10B, the input electric potential $V_{in1}$ is inputted to the source region of the transistor 277, and the input electric potential $V_{in1}$ is inputted to the source region of the transistor 278. Also, the bias electric potential $V_b$ is inputted to the source region of the transistors 279, 414. Then, an electric potential of the source region of the transistor 411 becomes the output electric potential $V_{out}$.

In the circuit shown in FIG. 10B, a portion surrounded by a dotted line indicated by 305 is the same structure as the differential amplifier shown in FIG. 8. Also, a portion surrounded by a dotted line indicated by 306 is the same structure as the source follower circuit shown in FIGS. 1A and B. Therefor, a detailed description of a structure of the operational amplifier shown in FIG. 10B is omitted. However, it is necessary that respective power supply electric potentials to be applied to the power supply lines 286 to 288 satisfy the above-described equations (22) to (24). Also, it is necessary that respective power supply electric potentials to be applied to the power supply lines 417, 418 satisfy the above-described equations (4) and (5). In addition, in this embodiment mode, the input electric potential $V_{in}$ in the above-described equation (4) corresponds to an electric potential of the drain region of the transistor 275.

Also, FIGS. 11A-B show an operational amplifier of a case that the transistor 412 is of p-channel type. A structure shown in FIG. 11B is the same as the operational amplifier shown in FIG. 10B, except for a point that the drain region of the transistor 414 is connected to the drain region of the transistor 413. Therefor, a detailed description of a structure of an amplifier shown in FIG. 11B is omitted. However, there is a necessity that respective power supply electric potentials to be applied to the power supply lines 286 to 288 satisfy the above-described equations (22) to (24). Also, there is a necessity that the power supply electric potential to be applied to the power supply line 417 satisfies the above-described equation (4). In addition, in this embodiment mode, the input electric potential $V_{in}$ in the above-described equation (4) corresponds to an electric potential of the drain region of the transistor 275. Further, there is a necessity that a power supply electric potential to be applied to the power supply line 418 satisfies the following equation (28).

$$V_{dd6} \leq (V_{in} - |V_{th414}|) \tag{28}$$

As just described, this invention provides an electric circuit which used a rectification type device through which an electric current flows in a single direction, when an electric potential difference was applied to electrodes at both ends of the device Then, this invention utilizes a fact that, when a signal voltage is inputted to one terminal of the rectification type device, an electric potential of the other terminal becomes an electric potential offset only by the threshold voltage of the rectification type device.

In sum, even if a variation of the threshold voltage occurs between the rectification type devices, the rectification type device can always provide an electric potential which was offset only by the threshold voltage of the rectification type device. The invention can provide an electric circuit in which affect of a variation of the threshold voltage between the rectification type devices was suppressed, by using the rectification type device. Then, to suppress an affect of a variation of the threshold voltages between the rectification type devices corresponds to that it is possible to provide an electric circuit in which an affect of a variation of the threshold voltages between the transistors was suppressed.

In addition, it is possible to arbitrarily combine this embodiment mode with the Embodiment mode 1.

Embodiment Mode 3

In this embodiment mode, a structure and its operation of a semiconductor apparatus having a photoelectric transducer device to which the invention was applied will be described by use of FIGS. 12A-C and 13.

Figure 12A:
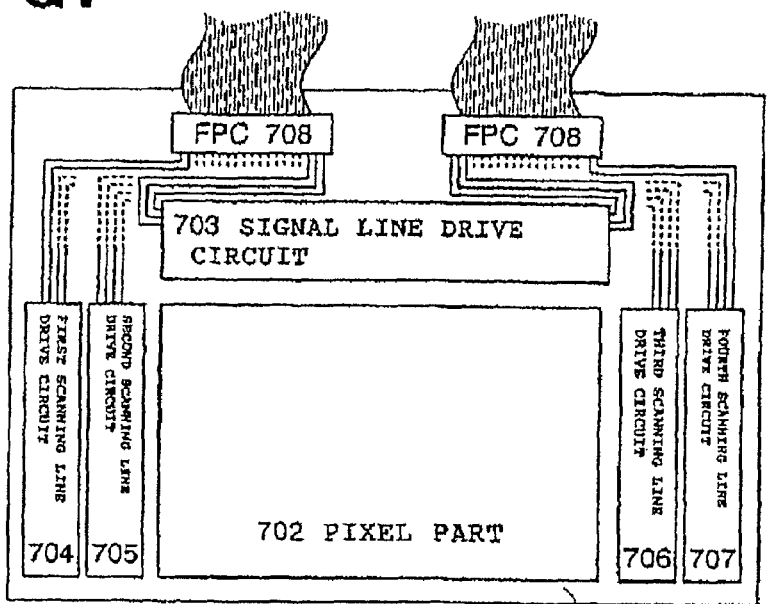
FIGS. 12A-C are views for showing a semiconductor apparatus of the invention.

The semiconductor apparatus shown in FIG. 12A has a pixel part 702 in which a plurality of pixels are disposed in a matrix shape, on a substrate 701, and has a signal line drive circuit 703 and first to fourth scanning line drive circuits 704 to 707, on the periphery of the pixel part 702. The semiconductor apparatus shown in FIG. 12A has the signal line drive circuit 703 and the four sets of scanning line drive circuits 704 to 707 but, this invention is not limited to this, and it is possible to dispose the arbitrary number of the signal line drive circuit and the scanning line drive circuit in compliance with a structure of pixels. Also, a signal is applied from outside to the signal line drive circuit 703 and the first to fourth scanning line drive circuits 704 to 707 through FPC 708. However, this invention is not limited to this, and the electric circuit except for the pixel part 702 may be supplied from outside by use of IC etc.

Figure 12B:
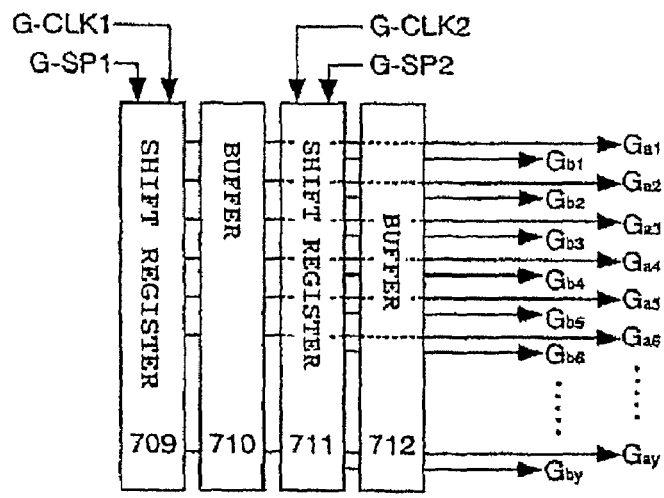

Firstly, structures of the first scanning line drive circuit 704 and the second scanning line drive circuit 705 will be described by use of FIG. 12B. Since the third scanning line drive circuit 706 and the fourth scanning line drive circuit 707 accord to the figure of FIG. 12B, showing in the figure is omitted.

The first scanning line drive circuit 704 has a shift register 709 and a buffer 710. The second scanning line drive circuit 705 has a shift register 711 and a buffer 712. Describing an operation briefly, the shift registers 709, 711 output sampling pulses sequentially, according to a clock signal (G-CLK), a start pulse (SP) and a clock inversion signal (G-CLKb). Thereafter, the sampling pulsed amplified by the buffers 710, 712 are inputted to scanning lines and have them fallen in a selection state one line by one line.

In addition, it is fine to form such a structure that, between the shift register 709 and the buffer 710, or between the shift register 711 and the buffer 712, a level shifter circuit was disposed. It is possible to enlarge an amplitude of a voltage, by disposing the level shifter circuit.

Figure 12C:
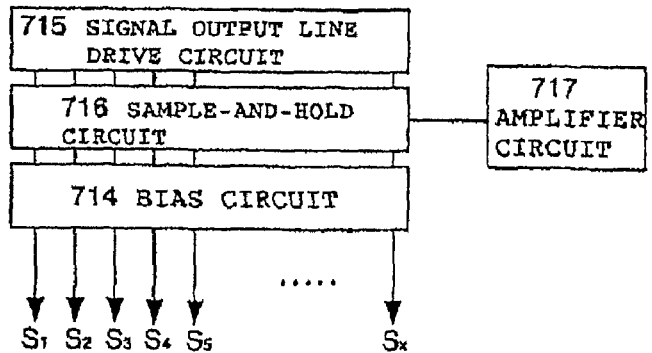

Then, a structure of the signal line drive circuit 703 will be described by use of FIG. 12C.

The signal line drive circuit 703 has a drive circuit 715 for a signal output line, a sample-and-hold circuit 716, a bias circuit 714 and an amplifier circuit 717. The bias circuit 714 forms a source follower circuit, by making a pair with an amplifying transistor of each pixel. The sample-and-hold circuit 716 has a function for temporarily storing a signal, for carrying out an analog to digital conversion, and for reducing noises. The drive circuit 715 for a signal output has a function for outputting a signal for outputting sequentially signals which were stored temporarily. Then, the amplifier circuit 717 has a circuit for amplifying a signal which was outputted from the sample-and-hold circuit 716 and the drive circuit 715 for the signal output. In addition, the amplifier circuit 717 may not be disposed in case that there is no necessity to amplify a signal.

Then, in the pixel part 702, structures and operations of a circuit of the pixel 713 which is disposed at i-th column and j-th row and the bias circuit 714 on the periphery of the i-th column will be described by use of FIG. 13.

Initially, structures of the circuit of the pixel 713 which is disposed at i-th column and j-th row and the bias circuit 714 on the periphery of the i-th column will be described.

The pixel 713 shown in FIG. 13 has first to fourth scanning lines $G_a(j)$ to $G_d(j)$, a signal line S(i), a first power supply line $V_a(i)$, and a second power supply line $V_c(i)$. Also, it has n-channel type transistors 254, 255, a photoelectric transducer device 257, and switches 250 to 253. The transistor 254 is of a diode connection, and corresponds to the rectification type device.

The bias circuit 714 has n-channel type transistors 256, 257, and a switch 258. The transistor 257 is of a diode connection, and corresponds to the rectification type device.

In this embodiment mode, the transistor 255 is of n-channel type but, this invention is not limited to this, and a p-channel type may be used for the same. However, since a source follower circuit is formed by the transistors 255 and 260, it is preferable that the both transistors have the same polarity.

The switches 250 to 254 and 258 are semiconductor devices having switching functions, and preferably, transistors are used for them. The switch 251 is controlled by a signal which is inputted from the first scanning line $G_a(j)$ to be turned ON or OFF. The switch 250 is controlled by a signal which is inputted from the second scanning line $G_b(j)$ to be turned ON or OFF. The switch 252 is controlled by a signal which is inputted from the third scanning line $G_c(j)$ to be turned ON or OFF. The switch 253 is controlled by a signal which is inputted from the fourth scanning line $G_d(j)$ to be turned ON or OFF. Also, the switch 258 is controlled by a signal which is inputted to be turned ON or OFF. However, for the purpose of simplifying the description, showing the signal line for inputting a signal to the switch 258 in the figure is omitted.

In the pixel 713, as for the source region and the drain region of the transistor 255, one is connected to the first power supply line $V_a(i)$, and the other is connected to the signal line S(i) through the switch 250. The gate electrode of the transistor 255 is connected to the drain region and the gate electrode of the transistor 254. One terminal of the photoelectric transducer device 257 is connected to the source region of the transistor 254 through the switch 252. The other terminal of the photoelectric transducer device 257 is connected to the power supply line 258. The ground electric potential $V_{ss}$ is applied to the power supply line 258.

Also, in the bias circuit 714, the drain region of the transistor 256 is connected to the signal line S(i), and the source region thereof is connected to the power supply line 260. The ground electric potential $V_{ss}$ is applied to the power supply line 260. Also, the gate electrode of the transistor 256 is connected to the gate electrode and the drain region of the transistor 257, and connected to the power supply line 259 through the switch 258. The ground electric potential $V_{dd}$ is applied to the power supply line 259. Also, the bias electric potential $V_b$ is applied to the source region of the transistor 257.

Then, in FIG. 13, a portion surrounded by a dotted line indicated by reference numeral 719 and a portion surrounded by a dotted line indicated by 714 correspond to the source follower circuit shown in FIGS. 1A and 1B. At this time, there is a necessity that an electric potential of the second power supply line $V_c(i)$ satisfies the following equation (29). In addition, in the equation (29), $V_{pd}$ means an electric potential of a signal which is read out from the photoelectric transducer device 257, and $V_{th254}$ means a threshold voltage of the transistor 254.

$$V_c \geq (V_{pd} + V_{th254}) \tag{29}$$

In the same manner, there is a necessity that the electric potential $V_{dd}$ of the power supply line 259 satisfies the following equation (30). In addition, in the equation (30), $V_{th257}$ means a threshold voltage of the transistor 257.

$$V_{dd} \geq (V_b + V_{th257}) \tag{30}$$

In addition, the above-described equations (29) and (30) are satisfied in case that the transistors 254, 255, 256, and 257 are of n-channel type. Here, in case that the transistors 254, 255, 256, and 257 are of p-channel type, the following equations (31) and (32) are satisfied.

$$V_c \leq (V_{pd} - |V_{th254}|) \tag{31}$$

$$V_{dd} \leq (V_b - |V_{th257}|) \tag{32}$$

Then, operations of the circuit of the pixel 713 disposed at the i-th column and the j-th row and the bias circuit 714 on the periphery of the i-th column will be briefly described.

Firstly, in the pixel 713, the switch 251 is turned ON. Then, other switches than the same are turned OFF. Then, an electric potential of the second power supply line $V_c(i)$ and electric potentials of the gate electrodes of the transistors 254, 255 become the same. As a result, the transistors 254, 255 are turned ON.

In the same manner, in the bias circuit 714, the switch 258 is turned ON. Then, the power supply electric potential $V_{dd}$ of the power supply line 259 and electric potentials of the gate electrodes of the transistors 256, 257 become the same. As a result, the transistors 256, 257 are turned ON.

Then, the switch 252 is turned ON. At this time, the switches 251, 258 are ON and other switches than them are maintained to be OFF. At this time, an electric potential of a signal which is read out from the photoelectric transducer device 257 designates $V_{pd}$.

Subsequently, in the pixel 713, the switch 251 is turned OFF. Then, the drain electric potential of the transistor 254 is decreased. Then, a voltage between the gate and the source of the transistor 254 becomes equal to a threshold voltage of the transistor 254, and the transistor 254 is turned OFF. At this time, the drain electric potential of the transistor 254 becomes $V_{pd} + V_{th254}$. In sum, it means that an operation for adding the threshold voltage $V_{th254}$ of the transistor 254 to the electric potential $V_{pd}$ of the signal to be inputted was carried out. In addition, it is fine that the switch 252 is turned from ON to OFF, after the transistor 254 was turned OFF.

In the same manner, in the bias circuit 714, the switch 258 is turned OFF. Then, the drain electric potential of the transistor 257 is decreased. Then, a voltage between the gate and the source of the transistor 257 becomes equal to a threshold voltage of the transistor 257, and the transistor 257 is turned OFF. At this time, the drain electric potential of transistor 257 become $V_b + V_{th257}$. In sum, it means that an operation for adding the threshold voltage $V_{th257}$ of the transistor 257 to the electric potential $V_b$ of a signal which is inputted was carried out.

Then, the switch 250 is turned ON. Then, other switches than the same is turned OFF. Then, an electric potential of the source region of the transistor 255 becomes the output electric potential $V_{out}$, and the output electric potential $V_{out}$ is outputted to the signal line S(i) through the switch 250, as a signal which was read out by the photoelectric transducer device 257.

Subsequently, the switch 253 is turned ON and other switches than it are all turned OFF. Then, the photoelectric transducer device 257 is initialized. For more detail, in order to realize such a situation that an electric potential of a n-channel side terminal of the photoelectric transducer device 257 becomes the same as an electric potential of the power supply line 258, it is arranged so that electric charges which are held by the photoelectric transducer device 257 flow in a direction of the power supply line V(i) through the switch 254. After that, the above-described operation is repeated.

As described above, this invention provides an electric circuit which used the rectification type device in which an electric current is generated only in a single direction, when an electric potential difference was applied to electrodes at both ends of the device. Then, the invention utilizes a fact that, when a signal voltage is inputted to one terminal of the rectification type device, an electric potential of the other terminal becomes an electric potential offset only by the threshold voltage of the rectification type device.

In sum, even if a variation of the threshold voltage occurs between the rectification type devices, the rectification type device can always provide an electric potential which was offset only by the threshold voltage of the rectification type device. The invention can provide an electric circuit in which affect of a variation of the threshold voltage between the rectification type devices was suppressed, by using the rectification type device. Then, to suppress an affect of a variation of the threshold voltages between the rectification type devices corresponds to that it is possible to provide an electric circuit in which an affect of a variation of the threshold voltages between transistors was suppressed.

As for this invention, It is possible to arbitrarily combine the Embodiments mode 1 to 3.

Embodiment Mode 4

In this embodiment mode, an example of an electric circuit to which the invention was applied which is different from the Embodiments mode 2 and 3 will be described by use of FIGS. 14A to 17.

Figure 14A:
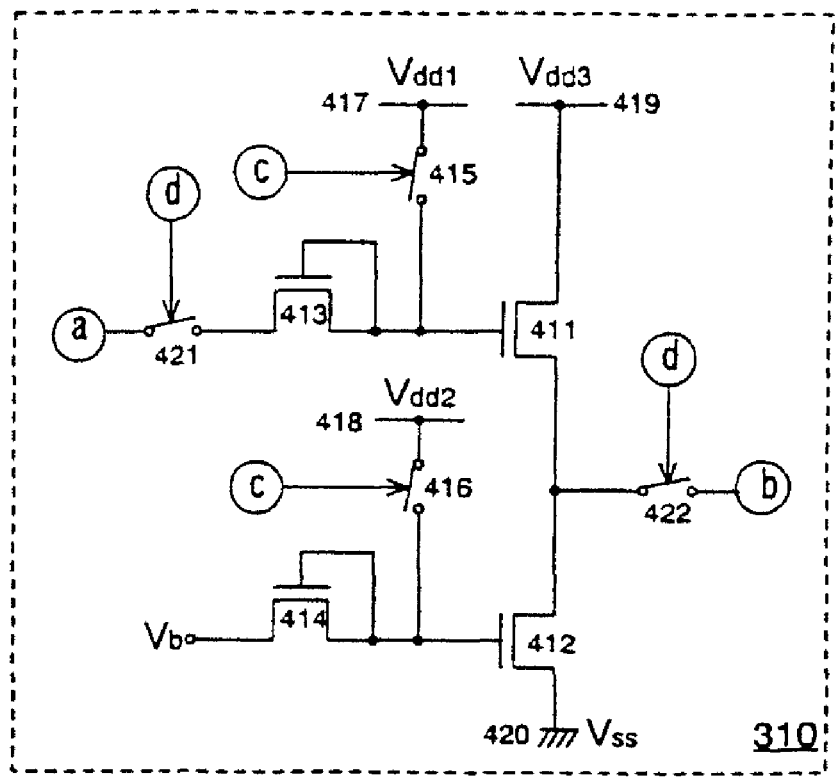
FIG. 14A and FIG. 14B are views for explaining a structure of an electric circuit of the invention.

In FIG. 14A, reference numeral 310 is of a structure in which switches 421, 422 are added to the source follower circuit shown in FIGS. 1A,1B and 2A. Since a circuit structure and an operation of the source follower circuit 310 are the same as FIGS. 1A, 1B and 2A, its description is omitted in this embodiment mode.

It was described that the operation of the source follower circuit 310 can be roughly divided into the setting operation and the output operation. In addition, the setting operation means an operation for giving a predetermined electric charge to the rectification type device, and corresponds to the operation shown in FIG. 1A. Also, the output operation means an operation for inputting the input electric potential $V_{in}$ and for taking out the output electric potential $V_{out}$, and corresponds to the operation shown in FIGS. 1B and 2A.

In the source follower circuit 310, a terminal a corresponds to an input terminal, and a terminal b corresponds to an output terminal. Then, the switches 415, 416 are controlled by a signal which is inputted from a terminal c. The switches 421, 422 are controlled by a signal which is inputted from a terminal d.

In addition, the circuit shown in FIGS. 1A-B and 2A was applied to this embodiment mode but, the circuit shown in FIG. 2B and FIGS. 7A and 7B may be used for it.

Figure 14B:
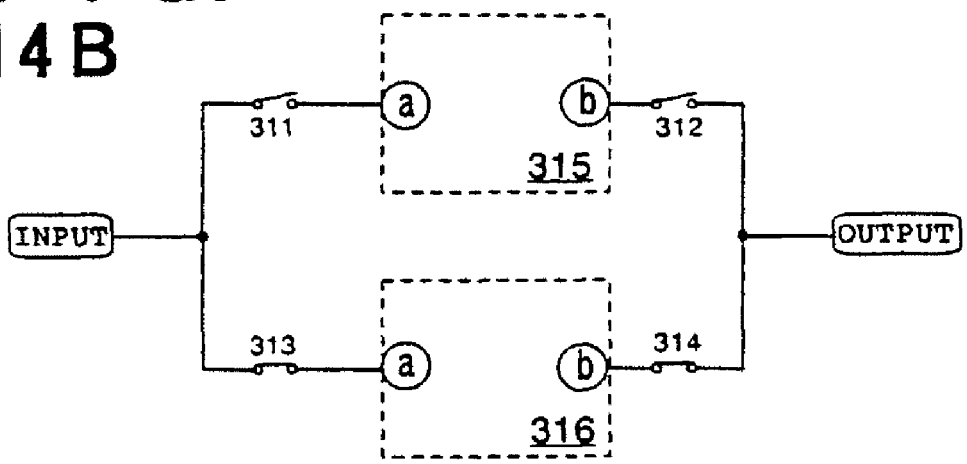

Then, when an electric circuit having the source follower circuit 310 is designed, as shown in FIG. 14B, it is fine to disposed at least two source follower circuits 315, 316. Then, it is fine that, out of the source follower circuits 315, 316, one carries out the setting operation and the other carries out the output operation. By doing this, since it is possible to do two things at the same time, and the operation does not have any waste, and there is no necessity of wasteful time, it is possible to carry out the operation of the electric circuit at high speed.

For example, when the signal line drive circuit is designed by use of the source follower circuit, it is fine to dispose at least two source follower circuits with respect to each signal line. Also, when the scanning line drive circuit is designed by use of the source follower circuit, it is fine to dispose at least two source follower circuits with respect to each scanning line. Also, when the pixel is designed by use of the source follower circuit, it is fine to dispose at least two source follower circuits with respect to each pixel.

Also, in FIG. 14B, reference numeral 311 to 314 designate switches. When the switches 311, 312 are ON, the switches 313, 314 are turned OFF. When the switches 311, 312 are OFF, the switches 313, 314 are turned ON. By doing this, it is arranged that, out of the two source follower circuits 315, 316, one carries out the setting operation, and the other carries out the output operation. In addition, without disposing the switches 311 to 314, the two source follower circuits 315, 316 may be controlled by controlling the switches 421, 422 that the source follower circuit 310 has.

Also, in this embodiment mode, portions 315, 316 surrounded by doted lines correspond to the source follower circuits but, this invention is not limited to this, and the differential amplifier and the operational amplifier etc. shown in FIGS. 8 to 11B etc. may be applied to it.

Then, in this embodiment mode, a structure and its operation of a signal line drive circuit in which at least two source follower circuits were disposed with respect to each signal line will be described by use of FIGS. 15 to 17.

FIG. 15 shows the signal line drive circuit, and the signal line drive circuit has a shift register 321, a first latch circuit 322, a second latch circuit 323, a D/A converter circuit 324 and a signal amplifier circuit 325.

In addition, in case that the first latch circuit 322 and the second latch circuit 323 are circuits which can store analog data, there are many cases that the D/A conversion circuit 324 can be omitted. Also, in case that data which is outputted to the signal line is of binary, i.e., digital quantity, there are many cases that the D/A converter circuit 324 can be omitted. Also, there is a case that a gamma compensation circuit is built in the D/A converter circuit 324. As just described, the signal line drive circuit is not limited to FIG. 17.

Describing the operation briefly, the shift register 321 is configured by use of a plurality of flip-flop circuits (FF) etc., and a clock signal (S-CLK), a start pulse (SP) and a clock inversion signal (S-CLKb) are applied to them. According to timings of these signals, sampling pulses are outputted sequentially.

The sampling pulses which were outputted from the shift register 321 are inputted to the first latch circuit 322. Video signals area inputted to the first latch circuit 322, and according to the timing when the sampling pulses are inputted, the video signals are stored at each column.

In the first latch circuit 322, when the storage of the video signals is completed up to a final column, in a horizontal flyback period, a latch pulse (Latch Pulse) is inputted to the second latch circuit 323, and the video signals which were stored in the first latch circuit 322 are transferred simultaneously to the second latch circuit 323. After that, the video signals which were stored in the second latch circuit 323, one row portion thereof, is simultaneously inputted to the D/A converter circuit 324. Then, an signal which is inputted from the D/A converter circuit 324 is inputted to the signal amplifier circuit 325.

During a period that the video signals which were stored in the second latch circuit 323 are inputted to the D/A converter circuit 324, in the shift register 321, the sampling pulses are outputted again. After that, this operation is repeated.

Then, a structure of the signal amplifier circuit 325 on the periphery of the three signal lines from the i-th column to a (i+2)th column will be described by use of FIG. 16.

The signal amplifier circuit 325 has tow source follower circuits 315, 316 with respect to each column. The source follower circuits 315, 316 have four terminals of a terminals a to d, respectively. The terminal a corresponds to input terminals of the source follower circuits 315, 316, and the terminal b corresponds to output terminals of the source follower circuits 315, 316. Also, the switches 415, 416 are controlled by a signal which is inputted from the terminal c, and the switches 421, 422 are controlled by a signal which is inputted from the terminal d.

Figure 16:
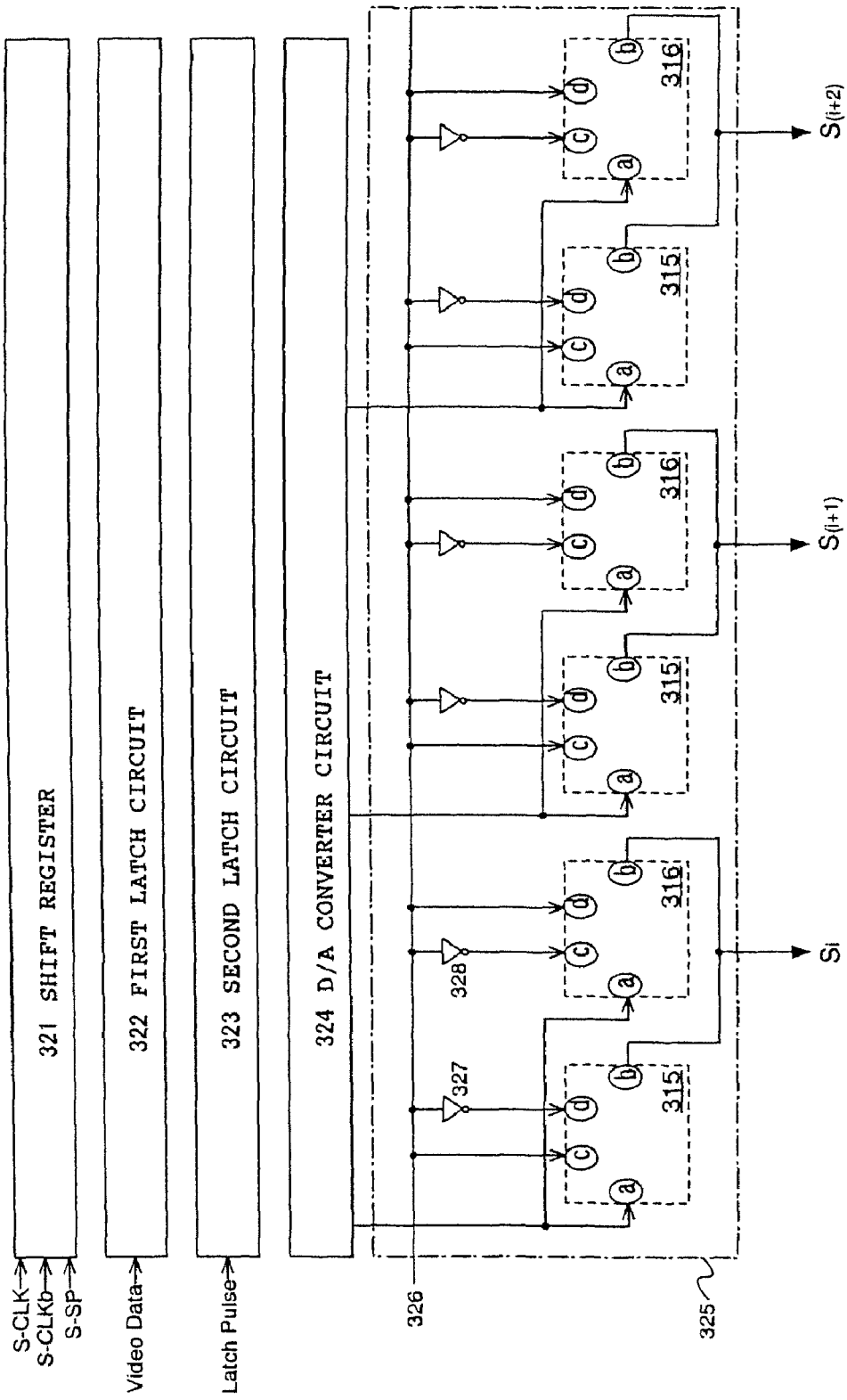
FIG. 16 is a view of the signal line drive circuit of the invention.

Also, in the signal amplifier circuit 325 shown in FIG. 16, between a setting use signal line 326 and the source follower circuits 315, 316, logical operators (inverters) indicated by 327, 328 are disposed. Then, to the terminals c and d, a signal which is outputted from the setting use signal line 327, or a signal which is outputted from an output terminal of the above-described logical operator is inputted.

Then, a signal which is outputted from a signal line indicated by the setting use signal line 326 and a signal which is inputted to respective switches through the terminals c to e, in the source follower circuits 315, 316 will be described by use of FIG. 17.

In addition, a switch to which a signal is inputted through the terminals c and d is turned ON when a signal of High is inputted, and when a signal of Low is inputted, it is turned OFF.

Figure 17:
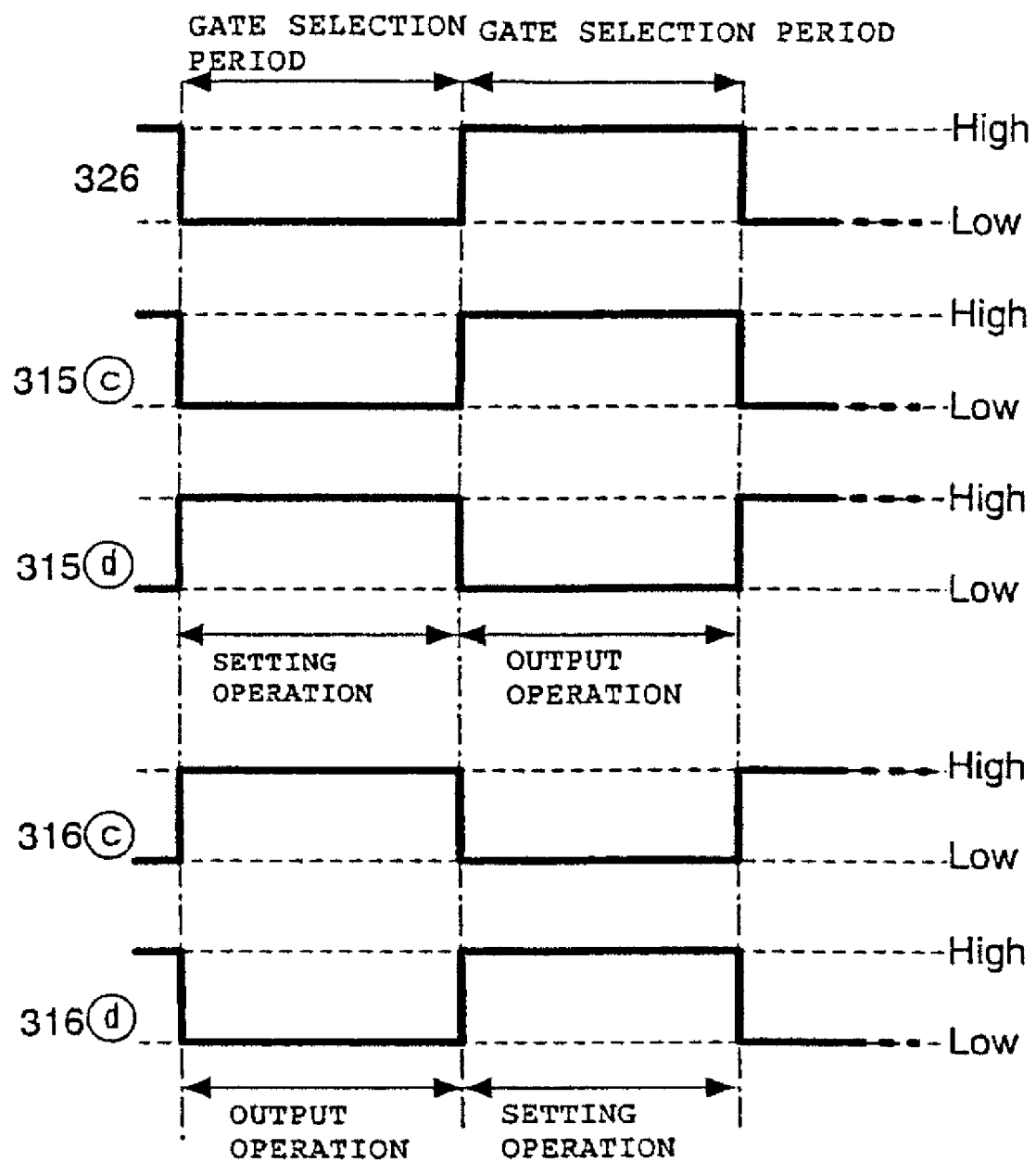
FIG. 17 is a view for explaining an operation of the signal line drive circuit of the invention.

Then, from the setting use signal line 326, a signal as shown in FIG. 17 is inputted. Then, to the terminal c in the source follower circuit 315, a signal which is outputted from the setting use signal line 326 is inputted as it is. To the terminal d, a signal which is outputted from an output terminal of an inverter 327 is inputted. By doing this, in the source follower circuit 315, it is possible to control so that one operation of the setting operation and the output operation is carried out.

In the same manner, to the terminal c in the source follower circuit 316, a signal which is outputted from an output terminal of an inverter 328 is inputted. To the terminal d, a signal which is outputted from the setting use signal line 326 is inputted as it is. By doing this, in the source follower circuit 316, it is possible to control so that one operation of the setting operation and the output operation is carried out.

As described above, this invention provides an electric circuit which used a rectification type device through which an electric current flows only in a single direction, when an electric potential difference was applied to electrodes at both ends of the device. Then, this invention utilizes a fact that, when a signal voltage is inputted to one terminal of the rectification type device, an electric potential of the other terminal becomes an electric potential offset only by the threshold voltage of the rectification type device.

In sum, even if a variation of the threshold voltage occurs between the rectification type devices, the rectification type device can always provide an electric potential which was offset only by the threshold voltage of the rectification type device. The invention can provide an electric circuit in which affect of a variation of the threshold voltage between the rectification type devices was suppressed, by using the rectification type device. Then, to suppress an affect of a variation of the threshold voltages between the rectification type devices corresponds to that it is possible to provide an electric circuit in which an affect of a variation of the threshold voltages between the transistors was suppressed.

In addition, there are many cases that a plurality of pixels are connected to tips of respective signal lines of this signal line drive circuit. There are many cases that the pixel is one which can change a situation by a voltage which is inputted from the signal line. As an example, a LCD and an organic EL etc. are cited. Other than that, it is possible to connect the pixels of various structures.

In addition, it is possible to arbitrarily combine this embodiment mode with the Embodiment modes 1 to 4.

Embodiment Mode 5

As an electronic apparatus which used the electric circuit of the invention, a video camera, a digital camera, a goggle type display (head mount display), a navigation system, an audio reproduction apparatus (car audio, audio component etc.), a notebook type personal computer, a game apparatus, a portable information terminal (mobile computer, portable telephone, portable type game machine or electronic book etc.), an image reproduction apparatus having a recording medium (concretely, apparatus which reproduces a recording medium such as Digital Versatile Disc (DVD) etc. and has a display for displaying its images) etc. are cited. A concrete example of those electronic apparatuses will be described in FIGS. 18A to 18H.

Figure 18A:
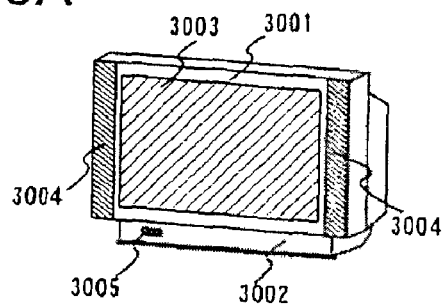
FIGS. 18A-H are views of electric apparatuses to which the invention is applied.

FIG. 18A shows a light emitting apparatus, which includes a housing 3001, a support table 3002, a display part 3003, a speaker part 3004, a video input terminal 3005 etc. This invention can be used for an electric circuit which comprises the display part 3003. Also, by this invention, the light emitting apparatus shown in FIG. 18A is accomplished. Since the light emitting apparatus is of self-luminous type, there is no necessity of a back light, and it is possible to form a thinner display part than a liquid crystal display. In addition, the light emitting apparatus includes all information display use display apparatuses such as personal computer use, TV broadcasting reception use, advertisement display use etc.

Figure 18B:
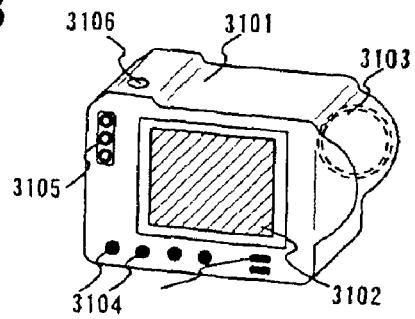

FIG. 18B shows a digital still camera, which includes a main body 3101, a display part 3102, a image reception part 3103, an operation key 3104, an external connection port 3105, a shatter 3106 etc. The invention can be used for an electric circuit which comprises the display part 3102. Also, by this invention, the digital still camera shown in FIG. 18B is accomplished.

Figure 18C:
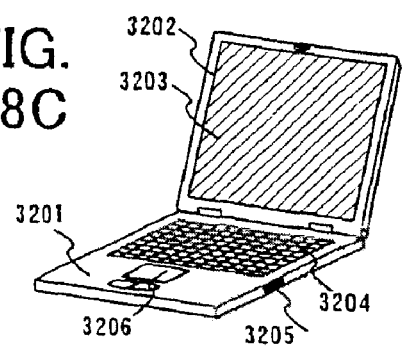

FIG. 18C shows a notebook type personal computer, which includes a main body 3201, a housing 3202, a display part 3203, a keyboard 3204, an external connection port 3205, a pointing mouse 3206 etc. This invention can be used for an electric circuit which comprises the display part 3203. Also, by this invention, the light emitting apparatus shown in FIG. 18C is accomplished.

Figure 18D:
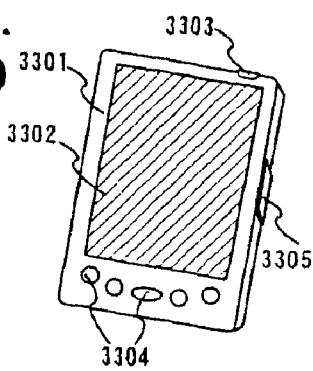

FIG. 18D shows a mobile computer, which includes a main body 3301, a display part 3302, a switch 3303, an operation key 3304, an infrared port 3305 etc. This invention can be used for an electric circuit which comprises the display part 3302. Also, by this invention, the mobile computer shown in FIG. 18D is accomplished.

Figure 18E:
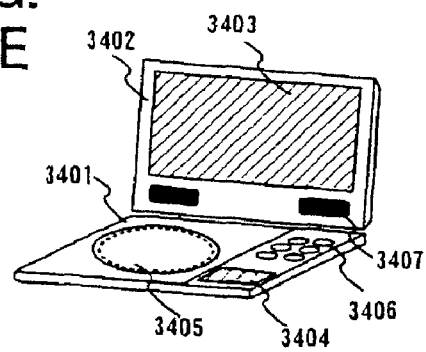

FIG. 18E shows a portable type image reproduction apparatus having a recording medium (concretely, DVD reproduction apparatus), which includes a main body 3401, a housing 3402, a display part A 3403, a display part B 3404, a recording medium (DVD etc.) reading part 3405, an operation key 3406, a speaker part 3407. The display part A 3403 mainly displays image information, and the display part B 3404 mainly displays character information and, this invention can be used for an electric circuit which comprises the display parts A, B 3403, 3404. In addition, the image reproduction apparatus having the recording medium includes a home use game machine etc. Also, by this invention, the DVD reproduction apparatus shown in FIG. 18E is accomplished.

Figure 18F:
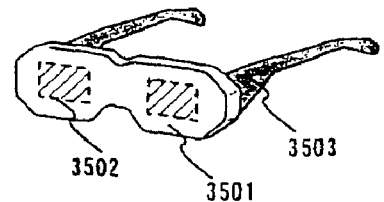

FIG. 18F shows a goggle type display (head mount display), which includes a main body 3501, a display part 3502, and an arm part 3503. This invention can be used for an electric circuit which comprises the display part 3502. Also, by this invention, the goggle type display shown in FIG. 18F is accomplished.

Figure 18G:
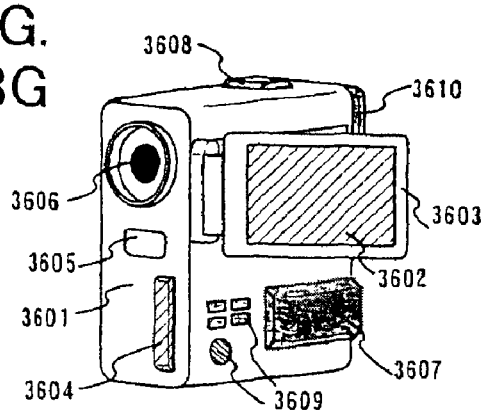

FIG. 18G shows a video camera, which includes a main body 3601, a display part 3602, a housing 3603, an external connection port 3604, a remote control reception part 3605, a image reception part 3606, a battery 3607, a sound input part 3608, an operation key 3609 etc. This invention can be used for an electric circuit which comprises the display part 3602. Also, by this invention, the video camera shown in FIG. 18G is accomplished.

Figure 18H:
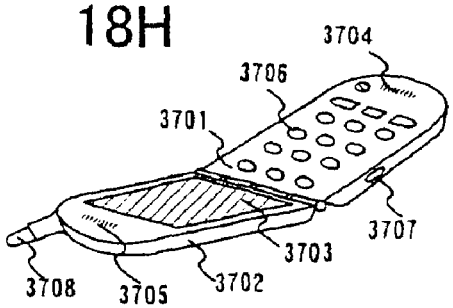

FIG. 18H shows a portable telephone, which includes a main body 3701, a housing 3702, a display part 3703, a sound input part 3704, a sound output part 3705, an operation key 3706, an external connection port 3707, an antenna 3708 etc. This invention can be used for an electric circuit which comprises the display part 3703. In addition, by displaying white characters against a black background, it is possible to suppress electric current consumption of the portable telephone. Also, by this invention, the portable telephone shown in FIG. 18H is accomplished.

In addition, if light emission luminance of a light emission material will become high in the future, it becomes possible to use light including outputted image information for a front type or a rear type projector by expanding and projecting the light by use of a lens etc.

Also, there are many cases that the above-described electronic apparatus displays information which was distributed through an electronic communication line such as Internet and CATV (cable TV) etc., and in particular, an opportunity for displaying moving image information has been increased. Since response speed of the light emission material is very high, the light emitting apparatus is desired for moving image display.

Also, since, as for the light emitting apparatus, a portion which is emitting light consumes electric power, it is desirable to display information so that the portion which emits light is reduced as much as possible. Accordingly, in case that the light emitting apparatus is used for a display part which mainly handles character information like a portable telephone and an audio reproduction apparatus, it is desirable to drive so that the character information is formed at the light emitting portion a background of a non-light emitting portion.

As described above, an applicable scope of the invention is extremely wide, and it is possible to use it for electronic apparatuses in every fields. Also, an electric circuit of an any structure shown in the Embodiment modes 1 to 4 may be used for the electronic apparatus of this embodiment mode.

This invention provides an electric circuit which used a rectification type device in which an electric current is generated only in a single direction, when an electric potential difference is applied to electrodes at both ends of the device. Then, the invention utilizes a fact that, when a signal voltage is inputted to one terminal of the rectification type device, an electric potential of the other terminal becomes an electric potential offset only by the threshold voltage of the rectification type device.

In sum, even if there occurs a variation of the threshold voltages between the rectification type devices, the rectification type device can always provide an electric potential offset by only the threshold voltage of the rectification type device. This invention, by using the above-described rectification type device, can provide an electric circuit in which an affect of a variation of the threshold voltages between the rectification type devices was suppressed. Then, to suppress an affect of a variation of the threshold voltages between the rectification type devices corresponds to that it is possible to provide an electric circuit in which an affect of a variation of the threshold voltages between the transistors was suppressed.

What is claimed is:

1. A semiconductor device comprising:
a driver circuit comprising a source follower circuit,
wherein the source follower circuit comprises a first transistor, a second transistor, a third transistor, a fourth transistor, a fifth transistor and a sixth transistor,
wherein one of a source and a drain of the first transistor is electrically connected to a first power supply line,
wherein one of a source and a drain of the second transistor is electrically connected to a second power supply line,
wherein the other of the source and the drain of the first transistor is electrically connected to the other of the source and the drain of the second transistor,
wherein one of a source and a drain of the third transistor is electrically connected to a gate of the first transistor,
wherein one of a source and a drain of the fourth transistor is electrically connected to a gate of the second transistor,
wherein one of a source and a drain of the fifth transistor is electrically connected to the gate of the first transistor, and
wherein one of a source and a drain of the sixth transistor is electrically connected to the other of the source and the drain of the first transistor.

2. The semiconductor device according to claim 1,
wherein a gate of the fifth transistor is electrically connected to the one of the source and the drain of the fifth transistor.

3. The semiconductor device according to claim 1,
wherein the one of the source and the drain of the second transistor is directly connected to the second power supply line.

4. The semiconductor device according to claim 1, further comprising a seventh transistor,
wherein one of a source and a drain of the seventh transistor is electrically connected to the gate of the second transistor, and
wherein a gate of the seventh transistor is electrically connected to the gate of the second transistor.

5. The semiconductor device according to claim 4, further comprising an eighth transistor,
wherein one of a source and a drain of the eighth transistor is electrically connected to the other of the source and the drain of the seventh transistor.

6. A display device comprising a pixel part and the semiconductor device according to claim 1.

7. An electronic apparatus comprising an image reception part and a display part comprising the display device according to claim 6.

8. A semiconductor device comprising:
a driver circuit comprising an amplifier,
wherein the amplifier comprise a first transistor, a second transistor, a third transistor, a fourth transistor, a fifth transistor, a sixth transistor, a seventh transistor and an eighth transistor,
wherein one of a source and a drain of the first transistor is electrically connected to a first power supply line,
wherein one of a source and a drain of the second transistor is electrically connected to one of a source and a drain of the seventh transistor, wherein the other of the source and the drain of the seventh transistor is electrically connected to a second power supply line, wherein the other of the source and the drain of the first transistor is electrically connected to the other of the source and the drain of the second transistor, wherein one of a source and a drain of the third transistor is electrically connected to a gate of the first transistor, wherein one of a source and a drain of the fourth transistor is electrically connected to a gate of the second transistor, wherein one of a source and a drain of the fifth transistor is electrically connected to the gate of the first transistor, wherein one of a source and a drain of the sixth transistor is electrically connected to the other of the source and the drain of the first transistor, and wherein one of a source and a drain of the eighth transistor is electrically connected to the second power supply line.

9. The semiconductor device according to claim 8,
wherein a gate of the fifth transistor is electrically connected to the one of the source and the drain of the fifth transistor.

10. The semiconductor device according to claim 8,
wherein the other of the source and the drain of the eighth transistor is electrically connected to the other of the source and the drain of the sixth transistor.

11. The semiconductor device according to claim 8,
wherein a gate of the seventh transistor is electrically connected to a gate of the eighth transistor.

12. The semiconductor device according to claim 8,
wherein the gate of the seventh transistor is electrically connected to the one of the source and the drain of the seventh transistor.

13. The semiconductor device according to claim 8, further comprising a ninth transistor,
wherein one of a source and a drain of the ninth transistor is electrically connected to the gate of the second transistor, and
wherein a gate of the ninth transistor is electrically connected to the gate of the second transistor.

14. The semiconductor device according to claim 13, further comprising a tenth transistor,
wherein one of a source and a drain of the tenth transistor is electrically connected to a gate of the sixth transistor.

15. The semiconductor device according to claim 14, further comprising an eleventh transistor,
wherein one of a source and a drain of the eleventh transistor is electrically connected to the gate of the sixth transistor, and
wherein a gate of the eleventh transistor is electrically connected to the gate of the sixth transistor.

16. A display device comprising a pixel part and the semiconductor device according to claim 8.

17. An electronic apparatus comprising an image reception part and a display part comprising the display device according to claim 16.

* * * * *